(12) United States Patent
Bawendi et al.

(10) Patent No.: US 11,866,629 B2
(45) Date of Patent: Jan. 9, 2024

(54) SCALABLE AND SAFE NANOCRYSTAL PRECURSOR

(71) Applicant: MASSACHUSETTS INSTITUTE OF TECHNOLOGY, Cambridge, MA (US)

(72) Inventors: Moungi Bawendi, Cambridge, MA (US); Daniel Franke, Cambridge, MA (US); Matthias Ginterseder, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/147,057

(22) Filed: Jan. 12, 2021

(65) Prior Publication Data

US 2021/0214611 A1 Jul. 15, 2021

Related U.S. Application Data

(60) Provisional application No. 62/960,671, filed on Jan. 13, 2020.

(51) Int. Cl.
| | |
|---|---|
| *C09K 11/88* | (2006.01) |
| *C09K 11/08* | (2006.01) |
| *H01L 29/06* | (2006.01) |
| *C01G 28/00* | (2006.01) |
| *C01B 19/04* | (2006.01) |
| *C01B 17/20* | (2006.01) |
| *C01G 30/00* | (2006.01) |
| *C01B 21/072* | (2006.01) |
| *C01B 21/06* | (2006.01) |
| *B82Y 40/00* | (2011.01) |

(52) U.S. Cl.
CPC ............ *C09K 11/883* (2013.01); *B82Y 40/00* (2013.01); *C01B 17/20* (2013.01); *C01B 19/04* (2013.01); *C01B 21/0632* (2013.01); *C01B 21/072* (2013.01); *C01G 28/00* (2013.01); *C01G 30/00* (2013.01); *C09K 11/0883* (2013.01); *H01L 29/0665* (2013.01)

(58) Field of Classification Search
CPC ... C09K 11/883; C09K 11/0883; C01B 17/20; C01B 19/04; C01B 21/0632; C01B 21/072; C01G 28/00; C01G 30/00
See application file for complete search history.

(56) References Cited

U.S. PATENT DOCUMENTS

| | | | |
|---|---|---|---|
| 6,576,291 B2 * | 6/2003 | Bawendi | C30B 29/605 |
| | | | 75/343 |
| 2011/0012087 A1 | 1/2011 | Allen et al. | |
| 2012/0193606 A1 * | 8/2012 | Bawendi | C09K 11/7492 |
| | | | 257/14 |

(Continued)

OTHER PUBLICATIONS

Yu et al. "Absorption cross section and related optical properties of colloidal InAs quantum dots." The Journal of Physical Chemistry B 109.15 (2005): 7084-7087, abstract; p. 7085 [online] <http://astro1.panet.utoledo.edu/relling2/PDF/pubs/absorption_cross_section_related_r_ellingson(2005)_j_phys_chem_n.pdf>.

(Continued)

*Primary Examiner* — C Melissa Koslow
(74) *Attorney, Agent, or Firm* — Honigman LLP

(57) ABSTRACT

A semiconductor nanocrystal can be made by an in situ redox reaction between an M donor and an E donor.

9 Claims, 22 Drawing Sheets

(56) References Cited

U.S. PATENT DOCUMENTS

2015/0252257 A1* 9/2015 Harris .............. H01L 21/02521
75/392

OTHER PUBLICATIONS

Ginterseder et al., "Scalable Synthesis of InAs Quantam Dots Mediated through Indium Redox Chemistry." Journal of American Chemical Society 142.9 (2020): 4088-4092, Feb. 19, 2020 (Feb. 19, 2020) [online] ,https://pubs.acs.org/doi/abs/10.1021/jacs.9b12350>.
International Search Report dated Apr. 1, 2021 in corresponding International Application No. PCT/US2021/013067.
Written Opinion of the International Searching Authority dated Apr. 1, 2021 in corresponding International Application No. PCT/US2021/013067.

* cited by examiner

SCALABLE AND SAFE NANOCRYSTAL PRECURSOR

CLAIM OF PRIORITY

This application claims the benefit of U.S. Provisional Application No. 62/960,671 filed on Jan. 13, 2020, which is incorporated by reference in its entirety.

FEDERALLY SPONSORED RESEARCH OR DEVELOPMENT

This invention was made with Government support under Grant No. ECCS-1449291 awarded by the National Science Foundation. The Government has certain rights in the invention.

TECHNICAL FIELD

The invention relates to semiconductor nanocrystals.

BACKGROUND

Nanocrystals having small dimensions can have properties intermediate between molecular and bulk forms of matter. For example, nanocrystals of semiconductor materials having sufficiently small dimensions can exhibit quantum confinement of excitons (excited state electron-hole pair) in all three dimensions. Quantum confinement leads to an increase in the effective band gap of the material with decreasing crystallite size. Consequently, both the optical absorption and emission of nanocrystals shift to the blue (i.e., to higher energies) as the size of the nanocrystal decreases.

The quantum efficiency of emission from nanocrystals having a core of a first semiconductor material can be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, both charge carriers of an exciton, i.e., electrons and holes, are confined in the core of the nanocrystal.

SUMMARY

Semiconductor nanocrystals can be highly luminescent, monodisperse, and composed of substantially non-toxic materials. The most well studied semiconductor nanocrystal system, cadmium selenide, provides highly luminescent and size controlled nanocrystals; however, cadmium is toxic. Nanocrystals that are highly luminescent, monodisperse, and composed of substantially non-toxic materials have the potential to be widely commercialized in such applications as biological imaging agents, photovoltaic cells, optoelectronic devices, and any other application where high quality non-toxic nanocrystals are necessary. Ternary and quaternary semiconducting materials (i.e., semiconducting materials that include three or four different elements, respectively) to create non-toxic, highly luminescent, and size controlled nanocrystals having a range of emission wavelengths that covers much of the visible to near infrared (NIR) regions.

In one aspect, a method of making a semiconductor nanocrystal can include contacting an M donor including a Group II element or Group III element in an oxidation state lower than the highest oxidation state of the Group II element or Group III element with an E donor including a Group V element or Group VI element in an oxidation state higher than the oxidation state of the Group V element or Group VI in a product semiconductor material. The method forms a population of nanocrystal cores including the product semiconductor material.

In certain circumstances, the product semiconductor can be a II-V, III-V, II-VI or III-VI semiconductor material or mixtures thereof.

In certain circumstances, the M donor can include In(I) or a mixture of indium species generating In(I).

In certain circumstances, the E donor can include As(III).

In certain circumstances, the M donor can include an In(I) halide.

In certain circumstances, the E donor can include a pnictogen atom in a formal oxidation state of +III surrounded by amino groups.

In certain circumstances, the method can include forming a first overcoating on a surface of the core, the first overcoating including a second semiconductor material. In another example, the method can also include forming a second overcoating on a surface of the first overcoating, the second overcoating including a third semiconductor material.

In certain circumstances, the nanocrystal can be obtained in nearly quantitative yield relative to the E donor or the M donor.

In certain circumstances, the decomposing can include heating.

In certain circumstances, a semiconductor nanocrystal can be made by the methods described herein.

Nanocrystals composed of substantially non-toxic materials can have quantum yields greater than 5%, greater than 10%, greater than 15%, greater than 20%, greater than 25%, greater than 30%, greater than 35%, or greater than 45%. Nanocrystals composed of substantially non-toxic materials can have emission wavelengths spanning the visible and near-infrared regions, such as, for example, emission wavelengths in the range of 540 nm to 975 nm. The nanocrystals can have a deviation from mean size of no greater than 25% rms, or a deviation from mean size of no greater than 15% rms.

Other features, objects, and advantages of the invention will be apparent from the description and drawings, and from the claims.

BRIEF DESCRIPTION OF THE DRAWINGS

(FIG. 4C). Absorption curves are offset for clarity.

(FIG. 6B). Final absorption spectrum of a gram scale batch of InAs QDs (FIG. 6C). Absorption curve progression of a synthesis conducted at 240° C. employing In(0) and In(III)Cl$_3$ (FIG. 6D). Absorption curves are offset for clarity.

FIGS. 8A and 8C show representative HR-TEM image with FIG. 8B magnified individual QDs from FIG. 8A exhibiting good crystallinity throughout the particles.

FIG. 9A shows an absorption curve of an aliquot withdrawn after 10 min of a standard synthesis at 240° C. FIG. 9B shows a corresponding TEM image exhibiting anisotropic QD growth.

FIG. 10A show tetrapodal QDs can be annealed to reach more spherical shape (FIG. 10B).

FIG. 11A shows absorption curves for a synthesis conducted with a combination of hot and continuous injection. Sustained growth of the formed InAs cores is observed. FIG. 11B shows absorption curves of a synthesis conducted solely by continuous injection of As precursor. The asterisk indicates residual solvent signal.

FIGS. 12A and 12B show representative HR-TEM images of core-shell QDs.

FIGS. 13A and 13C show typical progression of emission lineshape for CdS shell growth on top of InAs/CdSe QDs. FIGS. 13B and 13D show corresponding progression of QY and PL FWHM over the course of the shelling.

FIG. 14A shows typical progression of emission lineshape for ZnS shell growth on top of InAs/CdSe QDs. FIG. 14B show corresponding progression of QY and PL FWHM over the course of the shelling.

DETAILED DESCRIPTION

Figure 1A:
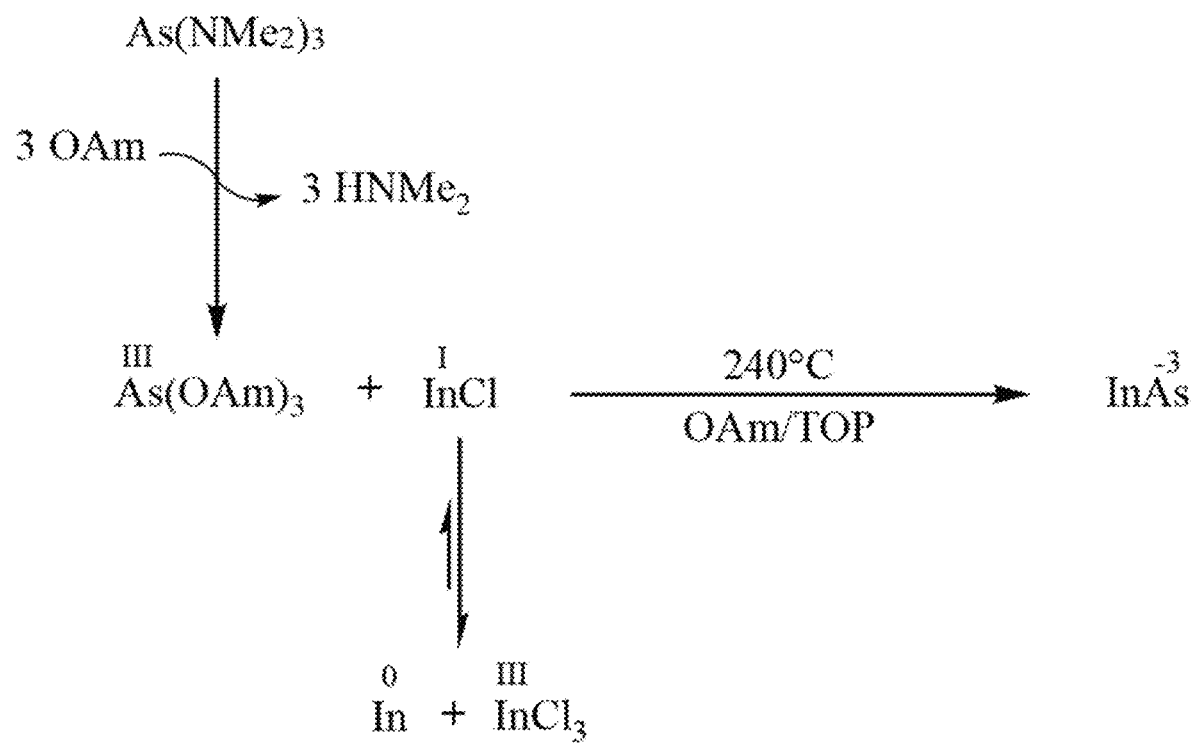
FIGS. 1A-1D are schematic depictions of a reaction scheme, emission spectra, HRTEM of final InAs QDs, and progression of growth observed through absorption and chemical yield.
Figure 1B:
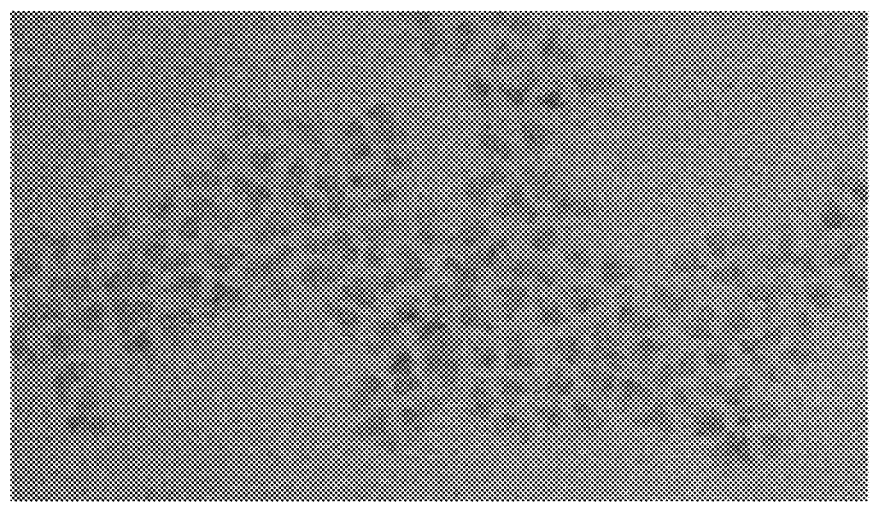
Figure 1C:
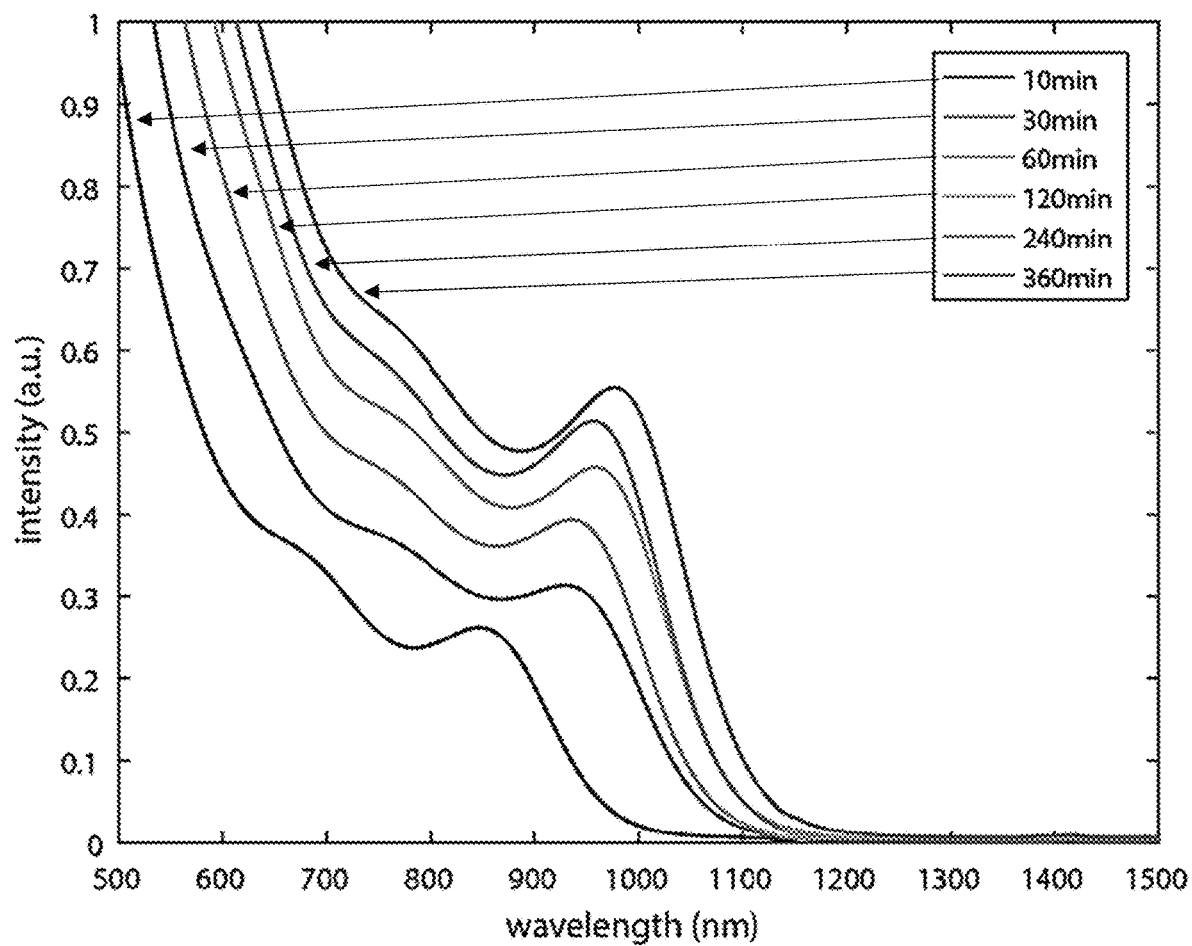
Figure 1D:
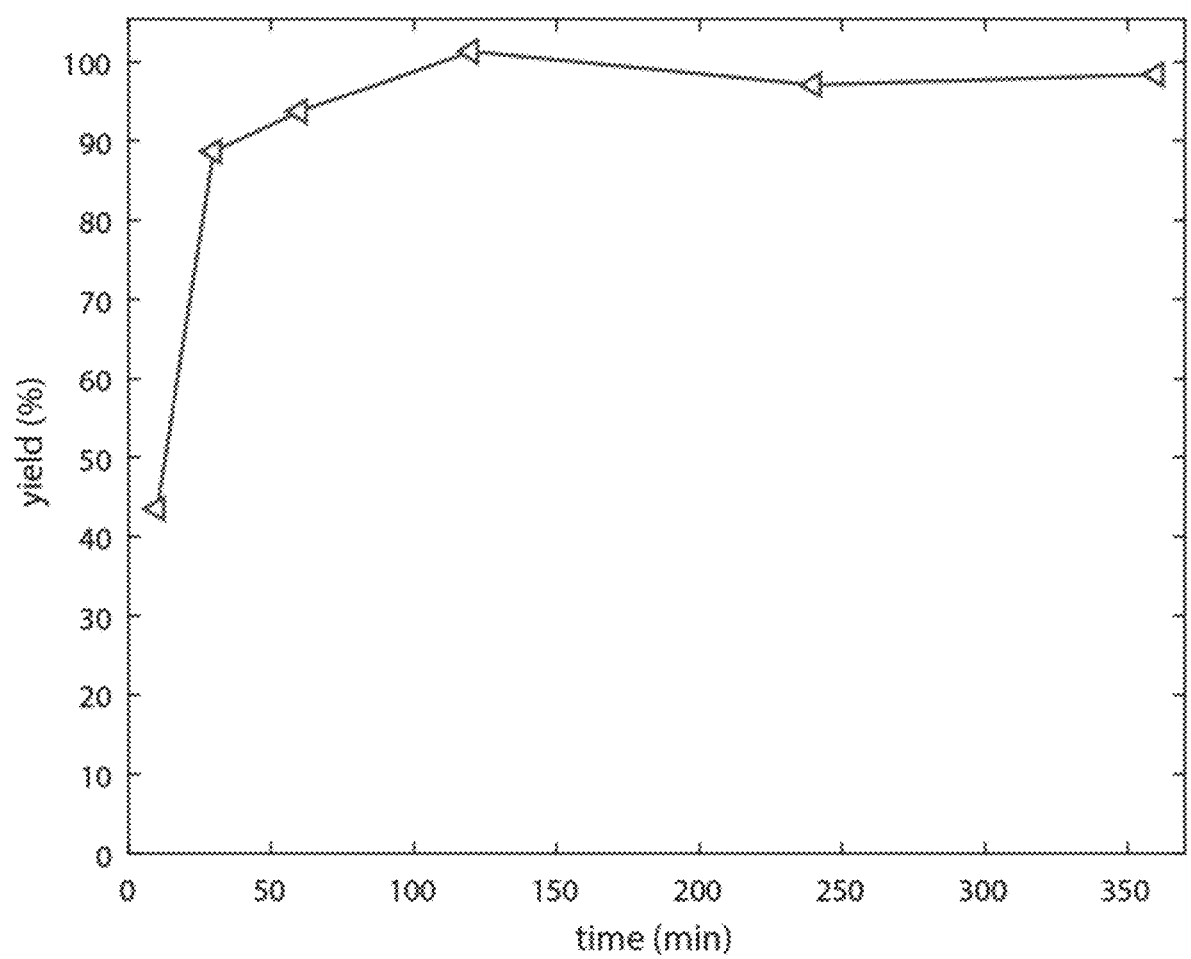

The InAs-based QDs described herein can be translated into a range of applications based on their optical and opto-electrical properties, scalability and safe synthesis. Potential applications include the use as bright fluorescent contrast agents for near-infrared and shortwave infrared biomedical imaging, use as active layers in photodetectors, use as downshifting layers to convert UV or visible light into near infrared or shortwave infrared light, use as sensitizer in photon upconversion materials, or use as electroluminescent materials for various applications, including facial recognition.

The invention described herein is a new synthetic method yielding colloidal indium arsenide quantum dots (InAs QDs) with potential applicability to other In-based semiconductors, as well as their incorporation in core-shell structures as a way of preparing them for numerous applications.

III-V semiconductors form an established group of materials optically active in the visible to infrared range with exceptional optical, electrical, and optoelectrical properties. Translating these materials to the nanoscale has led to an abundance of discoveries pushing the limits of contemporary semiconductor physics. To harness this potential on scale, there is great interest in colloidal synthesis routes providing solution-processable formulations.

However, applying synthetic insights gathered for other systems, such as II-VI semiconductors, has proven only moderately successful to this date. In addition, the increased reactivity of commonly used precursors in colloidal III-V synthesis consistently poses a safety concern, as well as a source of variability in the outcome of the synthesis. The newly developed strategy disclosed here makes use of a recently popularized arsenic precursor, and matches it with an indium precursor that acts both as the indium source and the reducing agent required to achieve the correct oxidation states for the formation of InAs.

For example, solution-processable III-V nanomaterials are a high performing material class promising to push the limits of optoelectronics. In particular, colloidal InAs quantum dots (QDs) stand out as an infrared-active candidate material for bioimaging, lighting and sensing applications. Despite significant development of their optical properties, the synthesis of InAs quantum dots still routinely relies on hazardous, commercially unavailable precursors. Herein, we describe a straightforward single hot injection procedure revolving around indium(I) chloride as the key precursor. Acting as a simultaneous reducing agent and indium source, indium(I) chloride smoothly reacts with a tris(amino)arsenic precursor to yield colloidal InAs quantitatively and at gram scale. Tuning the reaction temperature produces InAs cores with a first excitonic absorption feature in the range of 700-1400 nm. A dynamic disproportionation equilibrium between indium(I), indium metal and indium(III) opens up additional flexibility in precursor selection. CdSe shell growth on the produced cores enhances their optical properties, furnishing particles with center emission wavelengths between 1000 and 1500 nm and narrow photoluminescence full-width-at-half-maximum (FWHM) of about 120 meV throughout. The simplicity, scalability and tunability of the disclosed precursor platform are anticipated to inspire further research on indium-based colloidal QDs.

Figure 3:
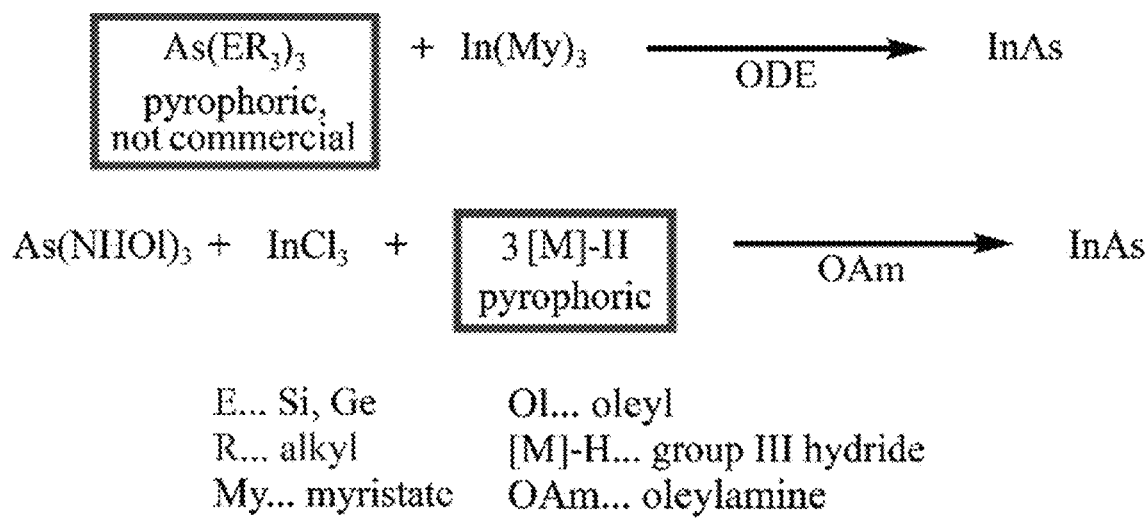
FIG. 3 is a scheme depicting established routes yielding high quality InAs QDs employing pyrophoric precursors.

III-V semiconductors form a class of materials with exceptional optoelectronic properties, and yet their colloidal, nanoscale synthesis still widely relies on pyrophoric and to-date commercially unavailable precursors. Here, we describe a new approach to the synthesis of indium arsenide QDs employing a redox-active indium precursor acting as both reducing agent and indium source. Traditionally, colloidal III-V semiconductor QDs are synthesized employing indium(III) carboxylates and pyrophoric pnictide precursors, as depicted in FIG. 3. Some of these precursors are not available commercially, hindering adoption by the scientific community and private industry alike. In recent years, an alternative set of synthesis routes has emerged harnessing tris(amino)arsine species as the arsenic precursor, together with indium(III) halides, in oleylamine as a coordinating solvent. These arsenic species exhibit markedly lower reactivity, rendering them attractive as a synthetic platform in the exploration of synthetic conditions towards quality nanomaterials with high tunability. However, the highly oxidized nature of the central arsenic(III) in these compounds necessitates the introduction of an external reducing agent, commonly in the form of group III metal hydrides. The high reactivity and concomitant pyrophoric nature of these agents has proven a consistent issue, in particular for large scale synthesis.

III-V semiconductors form a class of materials with exceptional optoelectronic properties, and yet their colloidal, nanoscale synthesis still widely relies on pyrophoric and to-date commercially unavailable precursors. Here, an approach to the synthesis of indium arsenide QDs is described employing a redox-active indium precursor acting as both reducing agent and indium source. Traditionally, colloidal III-V semiconductor QDs are synthesized employing indium(III) carboxylates and pyrophoric pnictide precursors, as depicted in FIG. 3. Some of these precursors are not available commercially, hindering adoption by the scientific community and private industry alike. In recent years, an alternative set of synthesis routes has emerged harnessing tris(amino)arsine species as the arsenic precursor, together with indium(III) halides, in oleylamine as a coordinating solvent. These arsenic species exhibit markedly lower reactivity, rendering them attractive as a synthetic platform in the exploration of synthetic conditions towards quality nanomaterials with high tunability. However, the highly oxidized nature of the central arsenic(III) in these compounds necessitates the introduction of an external reducing agent, commonly in the form of group III metal hydrides. The high reactivity and concomitant pyrophoric nature of these agents has proven a consistent issue, in particular for large scale synthesis.

For example, a method of making a semiconductor nanocrystal can include contacting an M donor including a Group II element or Group III element in an oxidation state lower than the highest oxidation state of the Group II element or Group III element with an E donor including a Group V element or Group VI element in an oxidation state higher than the oxidation state of the Group V element or Group VI in a product semiconductor material. The method forms a population of nanocrystal cores including the product semiconductor material. The product semiconductor can be a II-V, III-V, II-VI or III-VI semiconductor material or mixtures thereof. The product semiconductor can be an indium arsenide.

In certain circumstances, the M donor can include In(I) or a mixture of indium species generating In(I), for example, an In(I) halide.

In certain circumstances, the E donor can include As(III).

In certain circumstances, the E donor can include a pnictogen atom in a formal oxidation state of +III surrounded by amino groups.

Drawing from a vast body of literature on the rich redox chemistry of group III metals, indium(I) halides have been identified as a new alternative. Indium(I) has long been utilized as a mild reducing agent in synthetic organic chemistry, potentially eliminating the need for a highly reactive, external hydride source. Indium(I) chloride is commonly synthesized from indium metal and indium(III) chloride at high temperatures, however in solution it is often found to be prone to disproportionation. This additional equilibrium is hypothesized to pro-vide the active reductant in a controlled manner. Consequently, a concise synthetic approach to colloidal InAs QDs is proposed in FIG. 1A, which depicts a new route based on In(I)Cl exhibiting interconverting indium species. Combining both indium source and reducing agent in one species leads to a considerably more straightforward synthetic procedure compared to the best performing literature methods.

As-prepared InAs QDs are susceptible to degradation under ambient conditions, necessitating overcoating with additional layers of more robust semiconducting materials. A first shell of cadmium selenide (CdSe) renders the particles ready for many device-based applications, applying a second shell of either cadmium sulfide (CdS) or zinc sulfide (ZnS) furnishes constructs viable for in vivo imaging applications.

Two main routes have been described towards the synthesis of III-V QDs. The first is based on pnictogens in a formal oxidation state of −3, bound to trialkylsilyl or trialkylgermyl groups. These compounds are paired with indium (III) carboxylates to release trialkylsilyl/trialkylgermyl carboxylates and the corresponding indium pnictide. While this scheme is very efficient in terms of the number of reagents needed and the mechanism at work, the overly high reactivity of the group V precursors considerably limits the tunability of particle growth, in addition to most of these substances being pyrophoric and not commercially available.

The second route relies on a pnictogen precursor intensely investigated in recent years, featuring the central pnictogen atom in a formal oxidation state of +III, surrounded by amino groups. Since six electrons worth of reduction are needed on the pnictogens to allow for formation of III-V semiconductors, external reducing agents are employed together with an indium(III) halide. These reducing agents are typically highly reactive hydrides, and so far only pyrophoric reducing agents have been reported.

In contrast, the synthetic approach described here makes use of the rich redox chemistry of indium to provide a convenient and operationally simple alternative. In a typical synthesis, three equivalents of In(I)Cl are stirred in a mixture of oleylamine and trioctylphosphine at 240° C. under nitrogen. Tris(oleylamino)arsine in oleylamine is swiftly injected and the reaction allowed to proceed for two to six hours (FIGS. 1A-1D).

Figure 2:
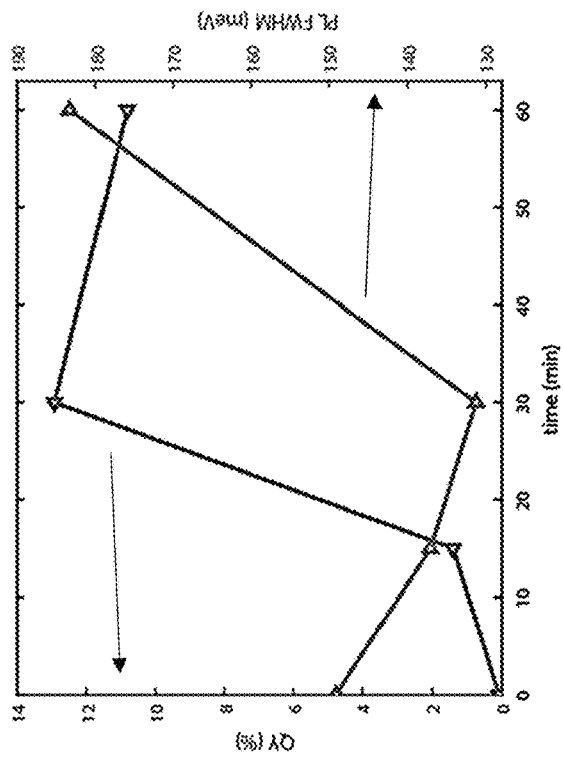
FIG. 2 depicts progression of photoluminescence (PL) spectra, quantum yields (QY) and PL linewidths over the course of the described shell growth procedures.
Figure 2:
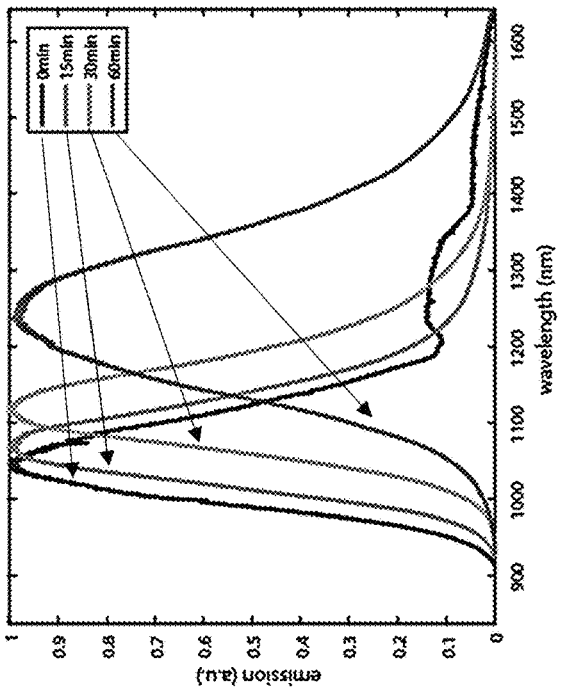

In(I)Cl is an easy-to-handle, commercially available salt which decomposes reversibly upon heating in solvent to give indium metal and In(III)Cl$_3$. In(I) left in solution is responsible for the conversion of the arsenic precursor; each equivalent is capable of providing two electrons, sequentially reducing Tris(oleylamino)arsine to yield As$^{3-}$. Slow regeneration of dissolved In(I) provides a convenient bottleneck in the overall formation of InAs, rendering the synthesis comparably robust in terms of scaling up. An added benefit is an essentially quantitative yield of InAs QDs with respect to the supplied arsenic precursor. The InAs QDs produced this way have been shown to integrate into shell growth schemes nicely (FIG. 2). A shell of CdSe can be grown by dispersing the cores in a mixture of OAm/1-octadecene (ODE) and continuously injecting cadmium oleate and trioctylphosphine selenide at temperatures above 200° C. This treatment dramatically improves quantum yield (QY) and stability. The quasi-type II heterostructure leads to a significant redshift of the photoluminescence, allowing for greater accessibility of the infrared spectral region. Growing a second shell around this InAs/CdSe core-shell construct further improves and stabilizes the optical properties, especially appreciated in biological applications. To this end, both CdS and ZnS are viable shell materials, ZnS confining charge carriers more efficiently. Similar to the first shell growth, the core-shell QDs are dispersed in a mixture of OAm/ODE and shell precursors (cadmium oleate and zinc oleate as well as ODE/sulfur, respectively) are slowly injected at temperatures above 200° C.

The overall methodology should be more general and open up routes to other indium-based QDs.

Figure 4A:
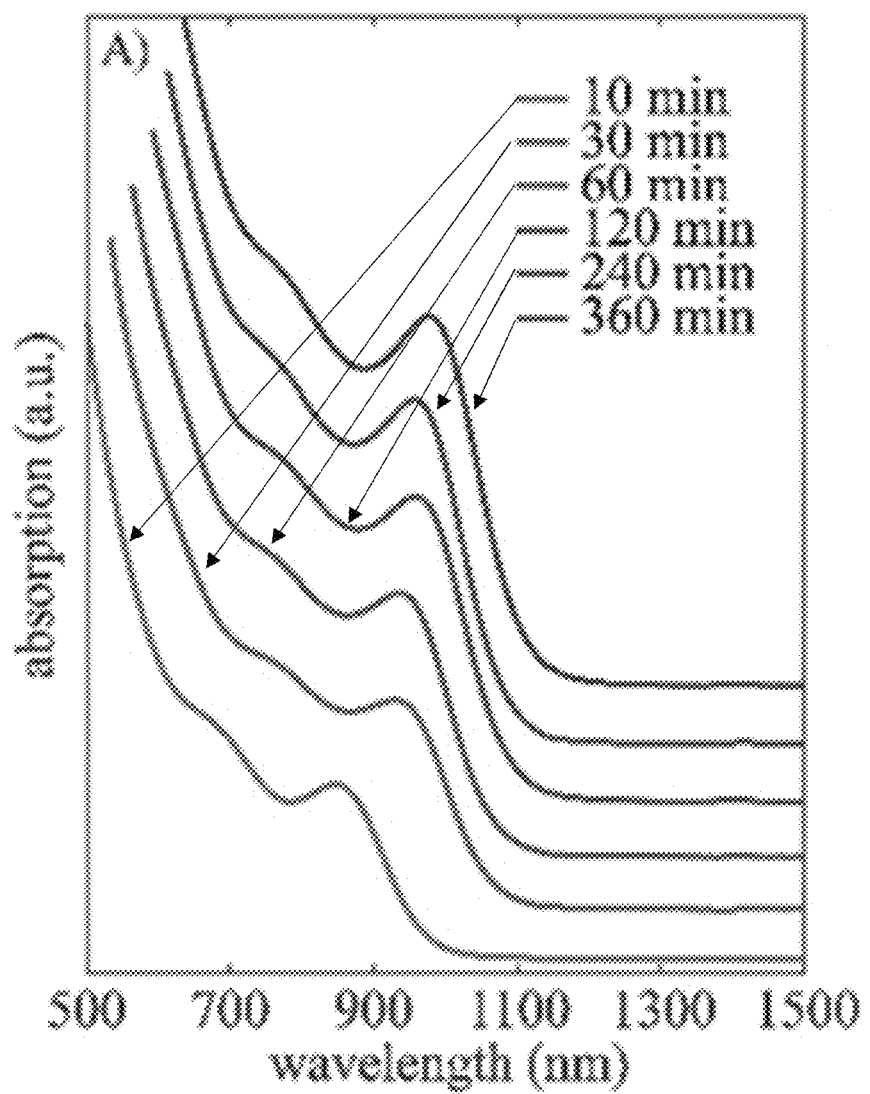
FIGS. 4A-4C depict graphs showing absorption spectra (FIG. 4A), maxima and half-width-at-half-maximum of lowest-energy electronic transition (FIG. 4B) as well as yield of InAs over the course of a core synthesis conducted at 240° C.
Figure 4B:
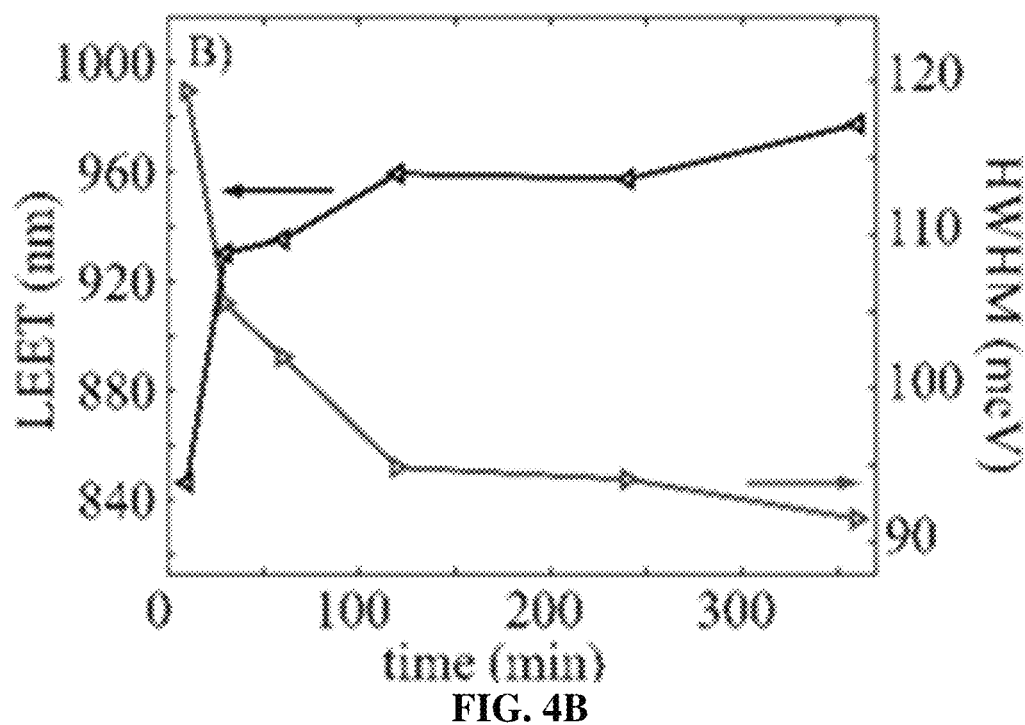
Figure 4C:
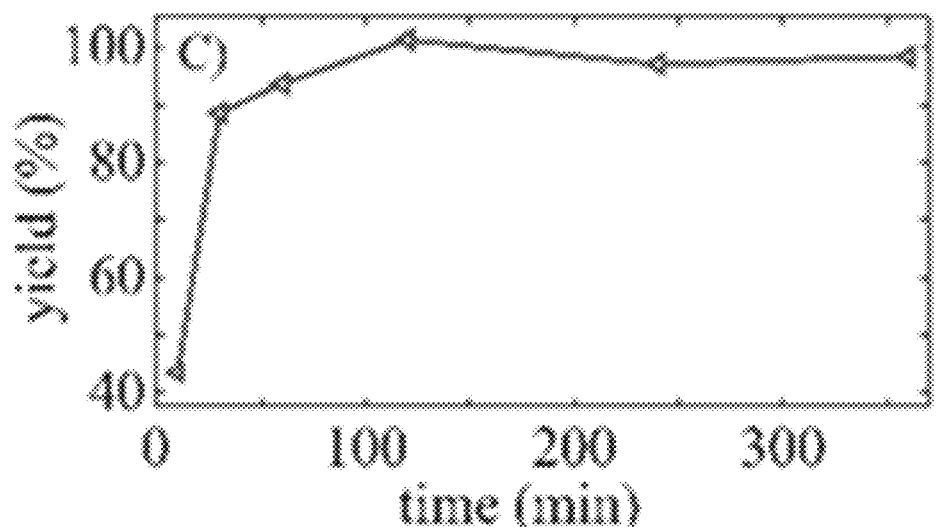

Shortly before synthesis, tris(dimethylamino)arsenic is subjected to a transamination with oleylamine as described previously. Oleylamine serves as the main solvent. Addition of trioctylphosphine has been found necessary to keep quality and yield of InAs QDs high. A typical progression of a synthesis conducted at 240° C. is shown in FIGS. 4A-4C. The lowest energy electronic transition (LEET), as tracked by the first absorption maximum and its half-width-at-half-maximum (HWHM), appears well developed over the entire course of the reaction. The feature approaches a final maximum of 977 nm and a narrow HWHM of 92 meV.

Figure 5A:
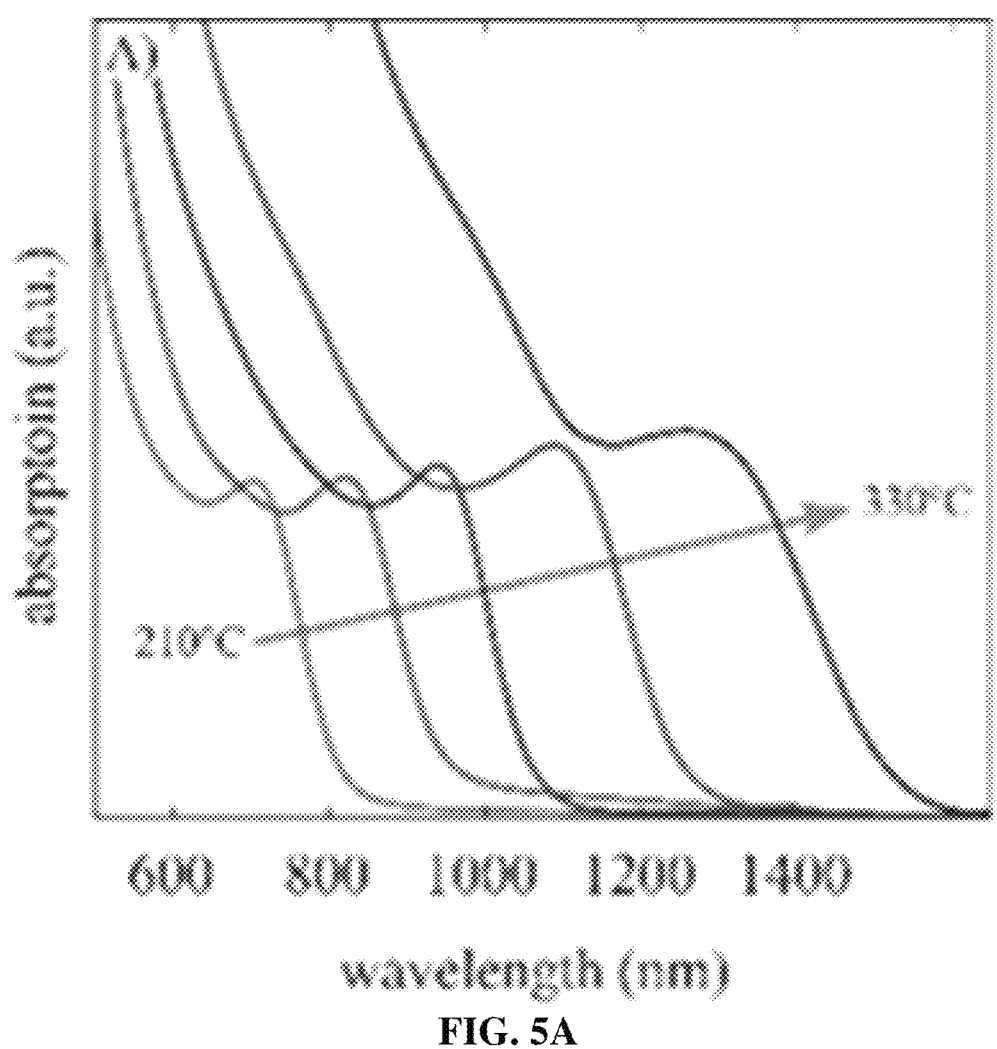
FIGS. 5A-5B depict a series of absorption curves showing variation in particle size as a function of reaction temperature (FIG. 5A) and HWHM of LEETs, exhibiting well-defined absorption features throughout (FIG. 5B).
Figure 5B:
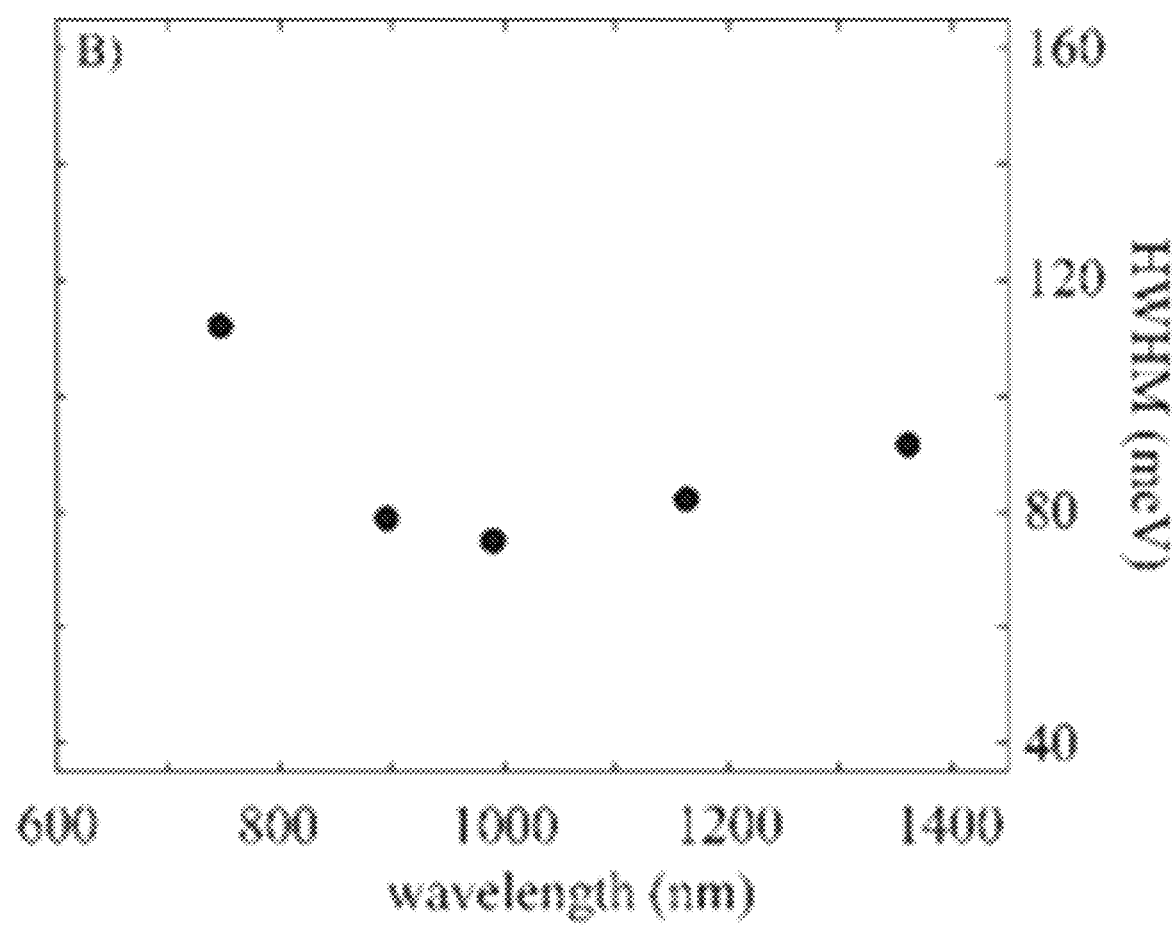

Furthermore, the chemical yield of the reaction, as tracked by the optical absorption at 450 nm, was analyzed. To this end, aliquots were purified through a single precipitation, redispersed in $CCl_4$ and pushed through a 200 nm syringe filter. Essentially complete conversion of the precursors to InAs within a reaction time of 90 min at this temperature is observed. The temperature is the main tunability parameter and can be set ranging from 210° C. to 330° C., furnishing InAs QDs with LEETs from 700 to 1400 nm through a single hot injection, demonstrating the versatility of this method (FIGS. 5A-5B). The points in FIG. 5B shows the HWHM as a function of wavelength. Particles with absorption features below 800 nm are accessed by adding dodecylphosphonic acid as an additional ligand before hot injection. The findings are summarized in Table 1. Early aliquots and samples synthesized at lower temperatures can appear tetrahedral in shape; temperatures above 300° C. as well as annealing lead to more spherical particles.

TABLE 1

Overview of reaction conditions and resultant InAs core optical absorption properties.

| Temperature/ ° C. | Additive | Reaction Time/min | First abs. feature/nm |
|---|---|---|---|
| 210 | 20 mg DDPA | 30 | 704 |
| 210 | 20 mg DDPA | 60 | 757 |
| 210 | — | 30 | 801 |
| 210 | — | 90 | 855 |
| 240 | — | 90 | 938 |
| 270 | — | 30 | 964 |
| 300 | — | 2 | 968 |
| 300 | — | 30 | 1051 |
| 310 | — | 10 | 1092 |
| 310 | — | 20 | 1139 |
| 320 | — | 60 | 1363 |

Figure 6A:
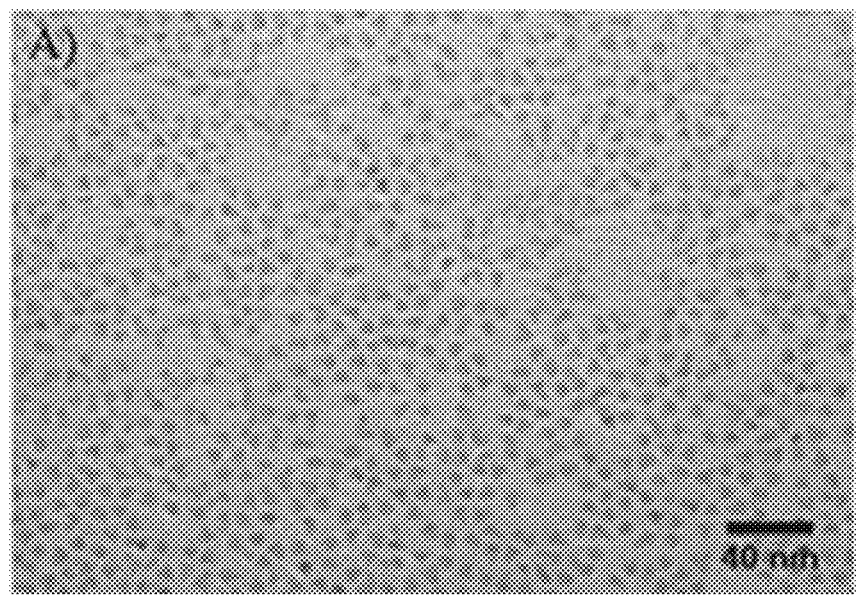
FIGS. 6A-6D depict exemplary HR-TEM (FIG. 6A), and powder X-ray diffraction pattern of InAs QDs synthesized at 320° C.
Figure 6B:
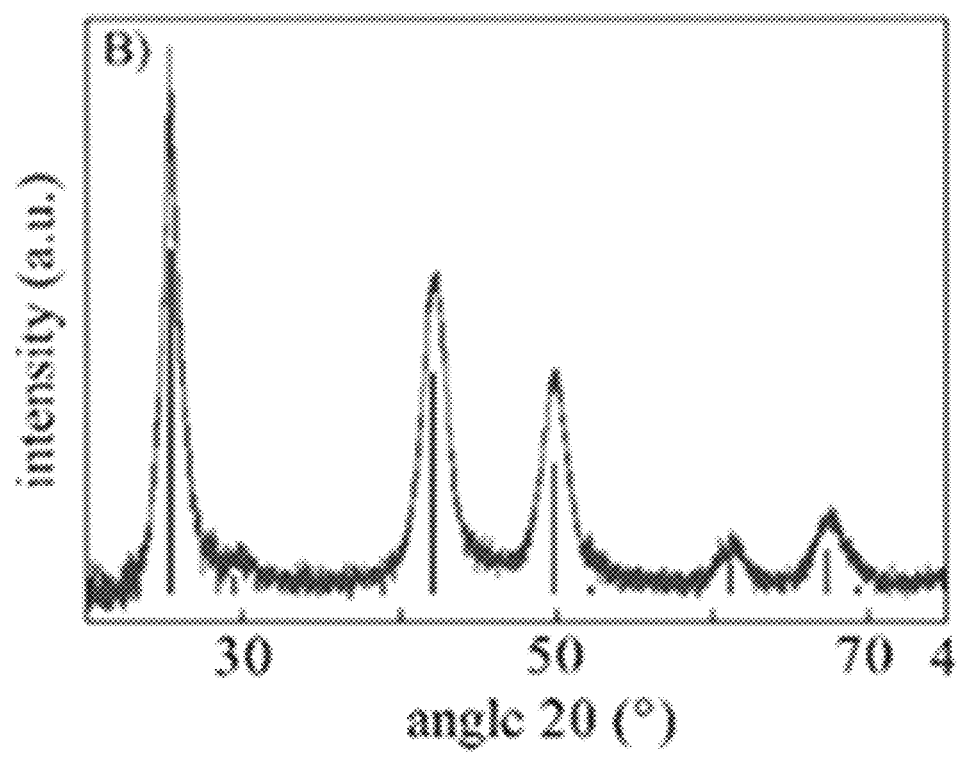
Figure 6C:
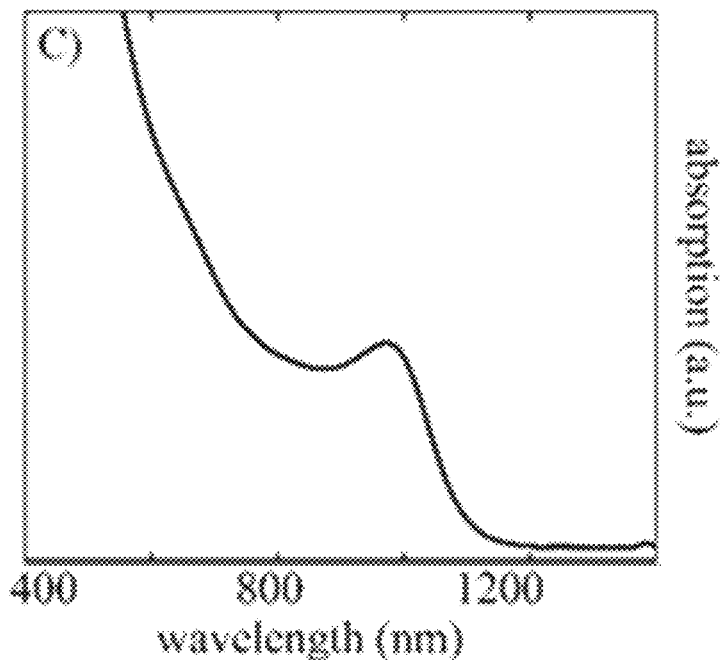
Figure 11A:
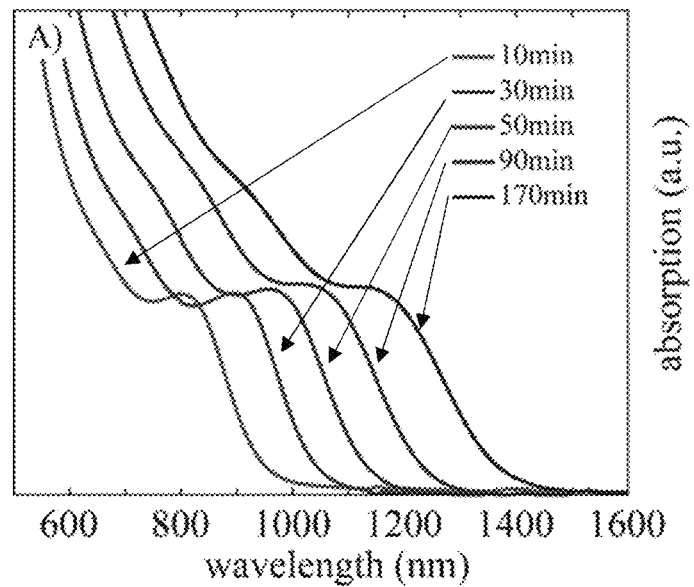
FIGS. 11A-11B show results of a continuous injection synthesis.
Figure 11B:
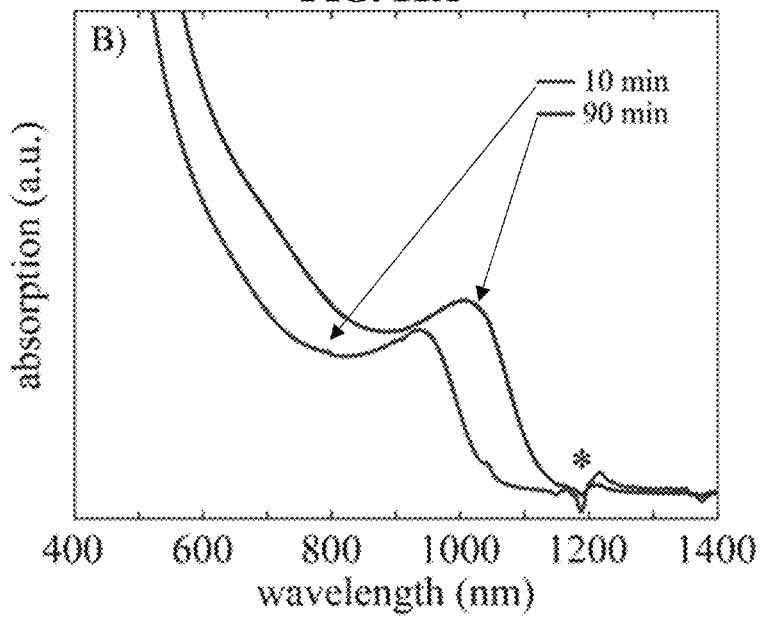
Figure 12A:
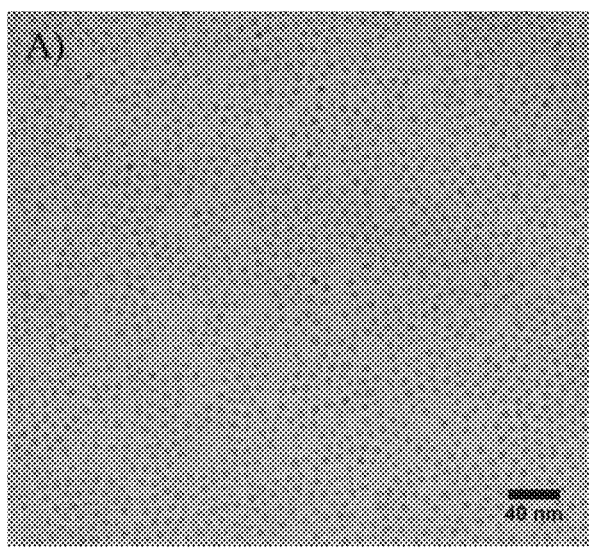
FIGS. 12A-12B show additional images of InAs/CdSe core-shell QDs.
Figure 12B:
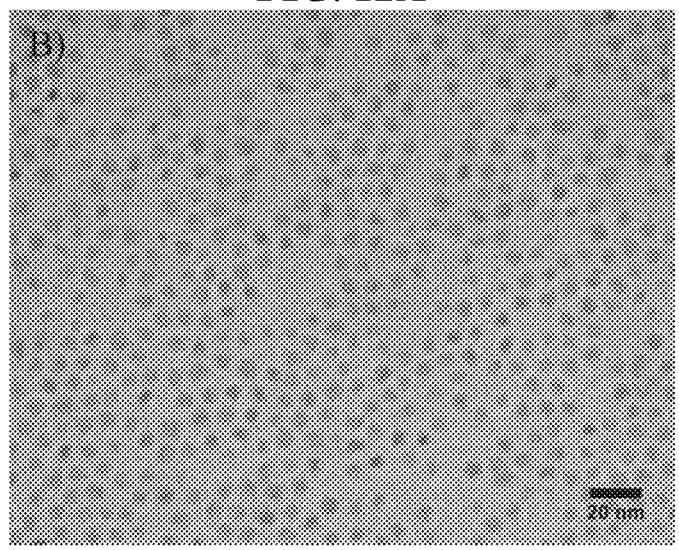
Figure 13A:
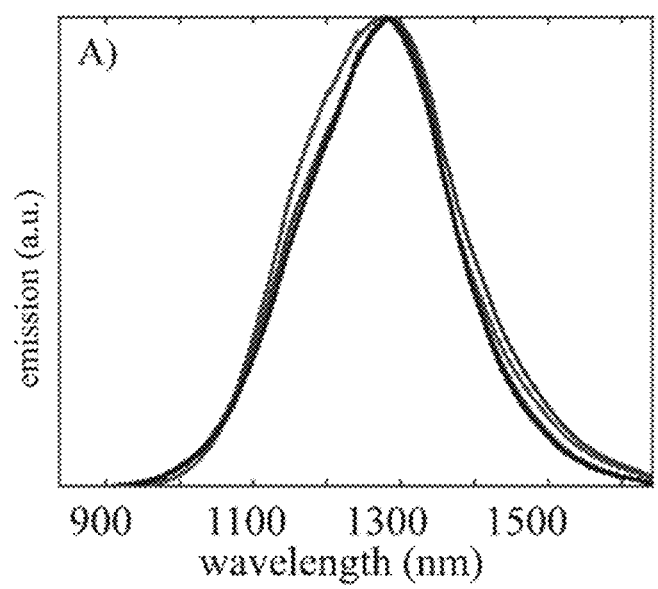
FIGS. 13A-13D show InAs/CdSe/CdS core-shell-shell growth.
Figure 13B:
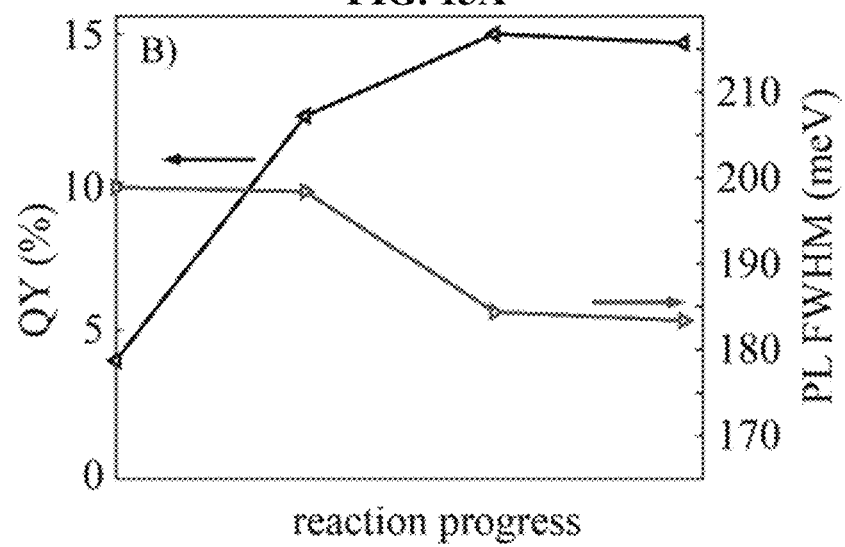
Figure 13C:
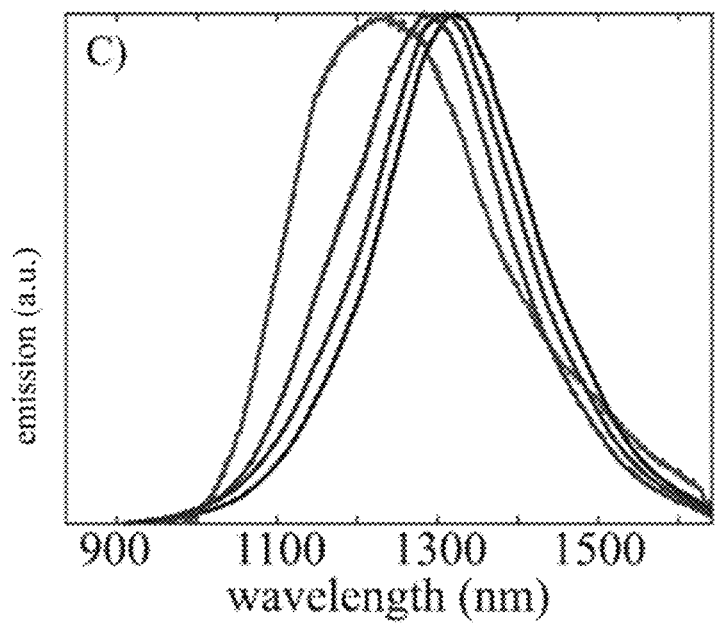
Figure 13D:
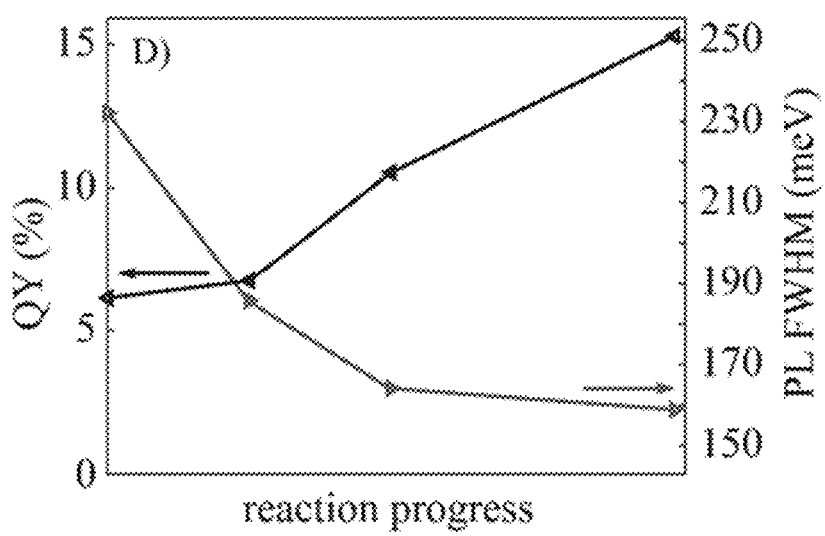
Figure 14A:
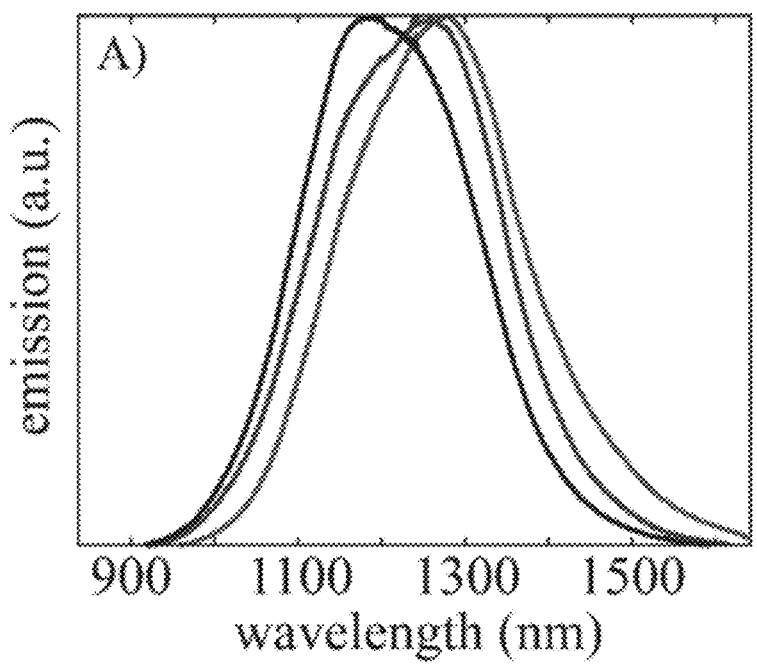
FIGS. 14A-14B depict InAs/CdSe/ZnS core-shell-shell growth.
Figure 14B:
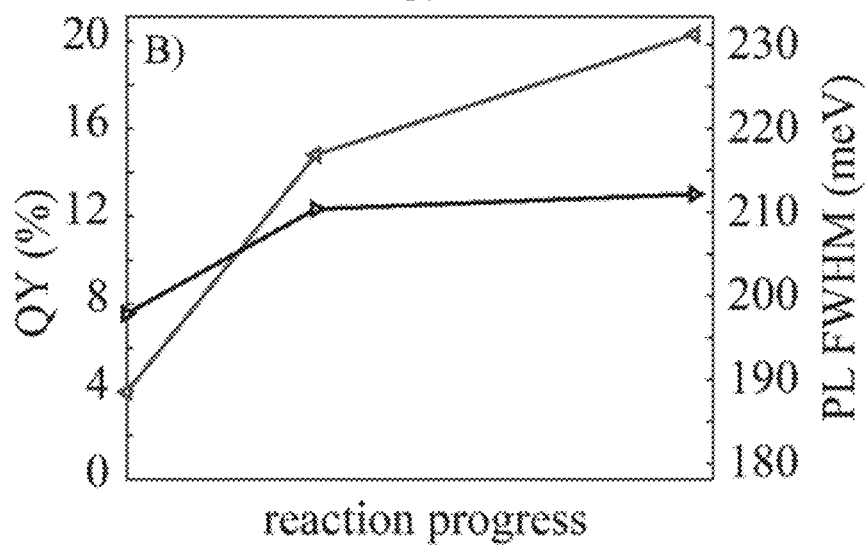

Following previous reports, large InAs cores with absorption features beyond 1000 nm can also be produced employing a continuous injection of at least parts of the As precursor (FIG. 11A-11B). Compared to the single hot injection method, both a hybrid approach with hot injection seeding and continuous injection growth as well as pure continuous injection yield particles with good red-shifted optical properties. FIG. 6A shows a representative high resolution-transmission electron microscope (HR-TEM) image of an InAs core sample synthesized at 320° C. Powder X-ray diffraction patterns (FIG. 6B) confirm the zinc blende crystal structure of the InAs QD cores. The absence of additional peaks corresponding to elemental indium or arsenic further supports a good match in reactivity within the precursor redox couple. While emission from InAs cores drawn directly from the reaction mixture is fully quenched, a standard workup procedure consisting of two precipitation re-dispersion cycles recovers emission properties typical of colloidal InAs quantum dot samples with photoluminescence quantum yields around one percent or less. In fact, the particles synthesized by the reported method can be worked up with benchtop solvents in air without compromising their optical properties, again emphasizing its robustness. Further, the protocol can be scaled to yield more than one gram of inorganic InAs cores, producing InAs QDs with essentially the same properties compared to small scale batches, as exemplified by an absorption spectrum in FIG. 6C.

Figure 6D:
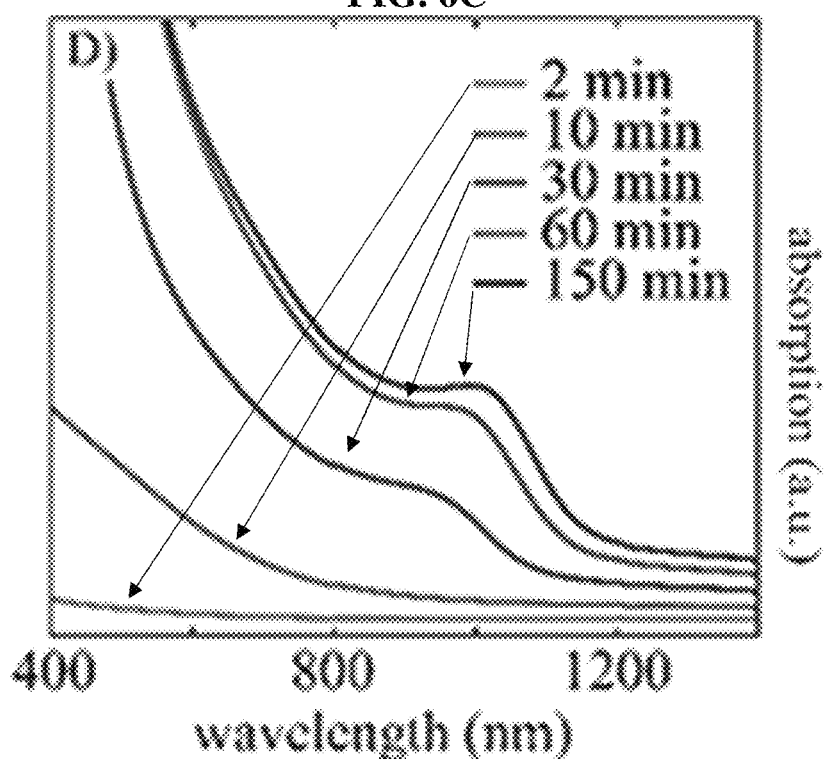

Investigating the nature of the indium equilibrium further, key insights can be confirmed. When conducting the synthesis under standard conditions, disproportionation of indium(I) chloride is indicated by the appearance of metallic indium at the bottom of the reaction vessel. Nevertheless, control experiments with only indium metal or indium(III) chloride as indium source proved unsuitable for the synthesis of InAs QDs. Conversely, providing both species instead of indium(I) chloride should enable the formation of InAs QDs in case of an accessible equilibrium. FIG. 6D shows the progression of an experiment conducted employing an appropriate mixture of indium metal and indium(III) chloride together, furnishing final particles in a manner comparable to the standard procedure.

Figure 7A:
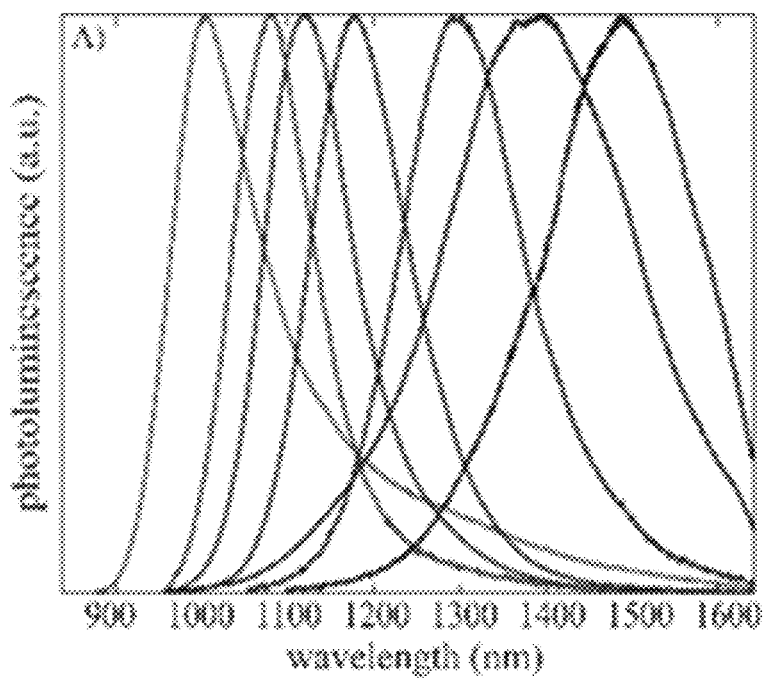
FIGS. 7A-7D depict tunability of emission properties of InAs/CdSe core-shell QDs with different core sizes (FIG. 7A). Narrow PL FWHM of approx. 120 meV are maintained throughout the whole tunability range (FIG. 7B). HR-TEM of core shell particles (FIG. 7C). Typical evolution of PLQY and PL FWHM during shell growth (FIG. 7D).
Figure 7B:
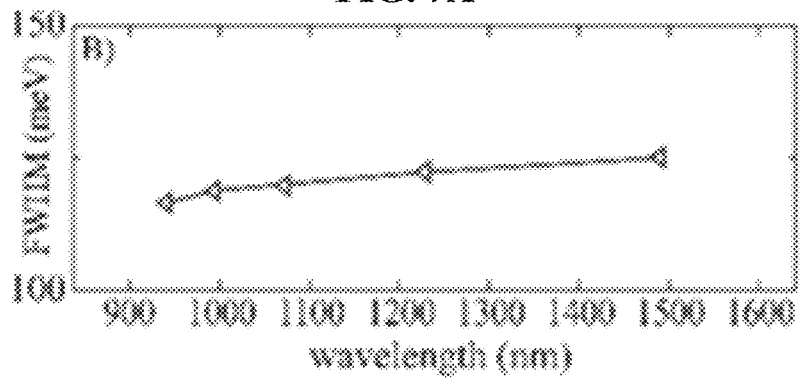
Figure 7C:
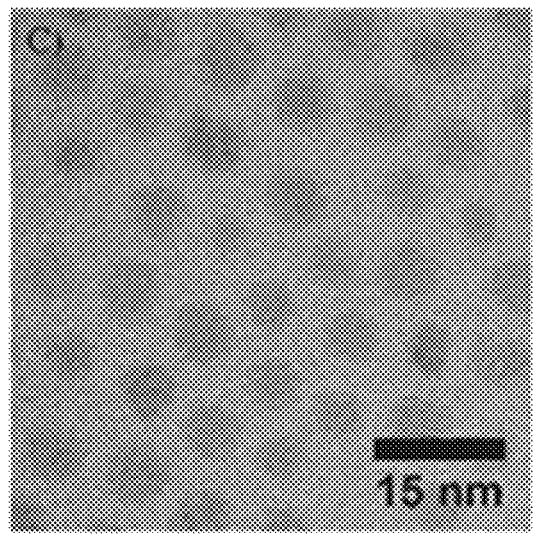
Figure 7D:
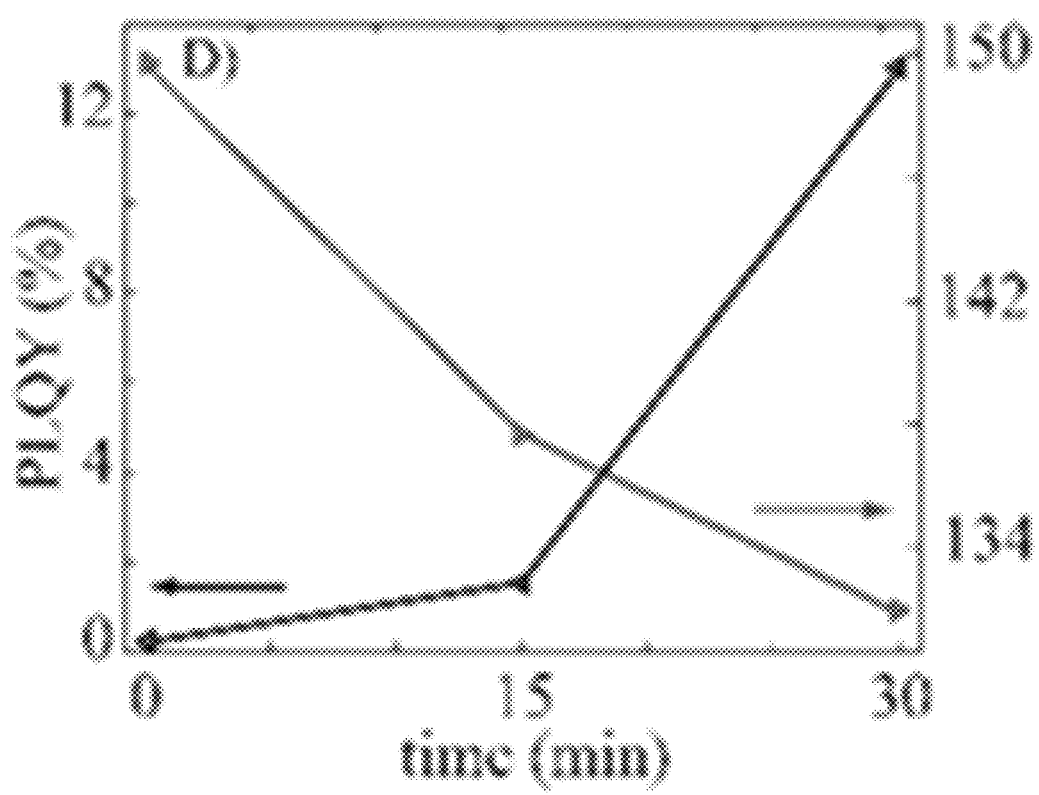
Figure 8A:
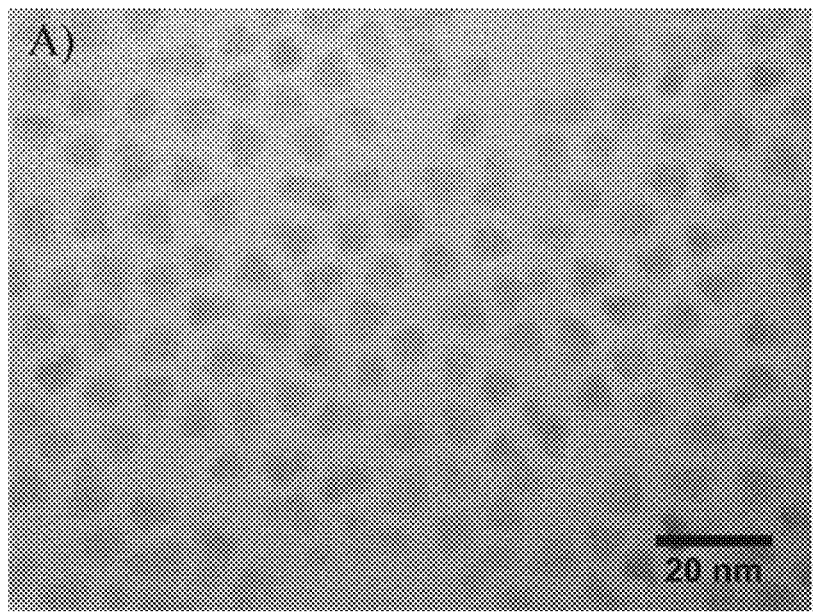
FIGS. 8A-8C depict additional HR-TEM images of InAs QDs synthesized at 320° C.
Figure 8B:
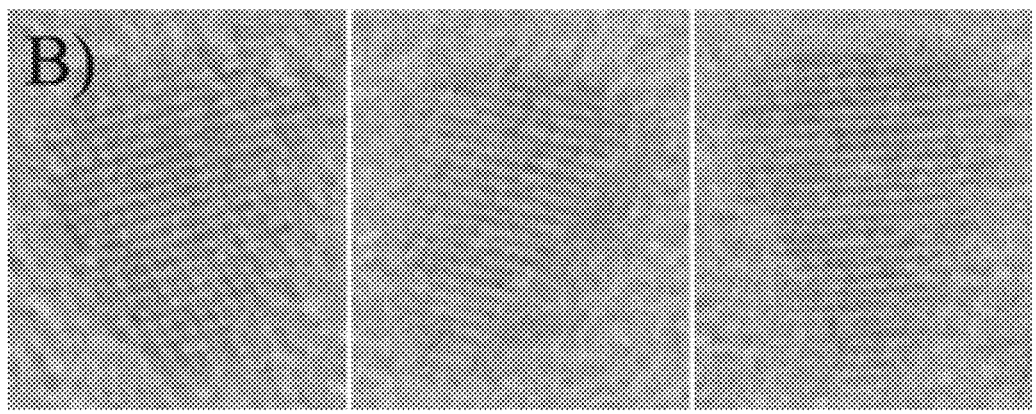
Figure 8C:
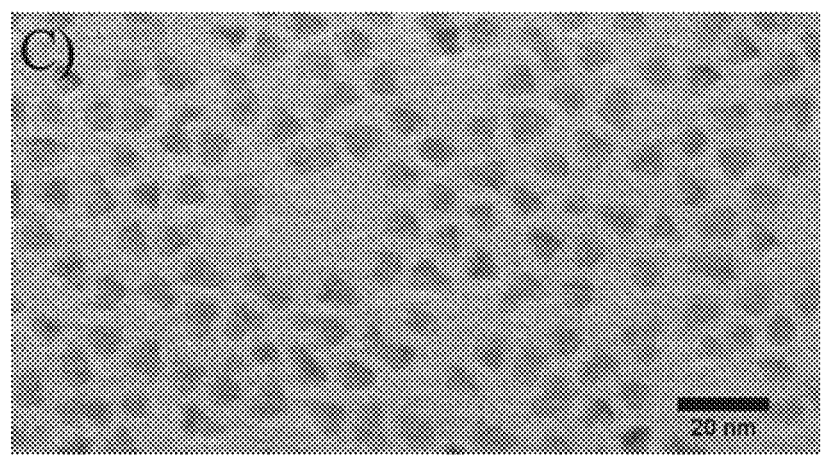
Figure 9A:
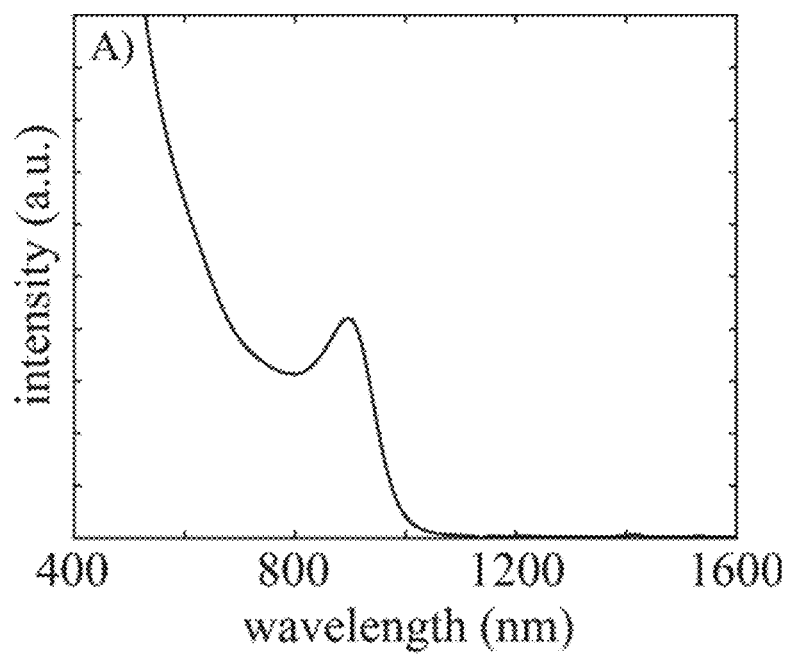
FIGS. 9A-9B show properties of InAs tetrapods grown at early times and low temperature during InAs core synthesis. At early times and intermediate temperatures, InAs QDs can appear tetrapodal.
Figure 9B:
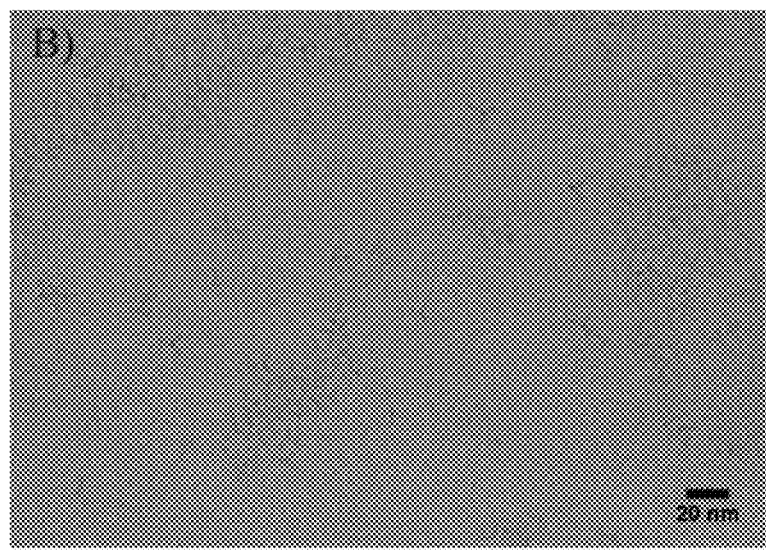
Figure 10A:
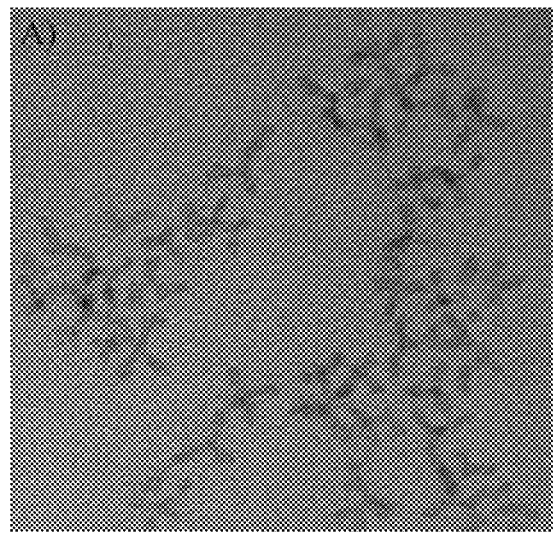
FIGS. 10A-10B show annealing of tetrapodal InAs QDs.
Figure 10B:
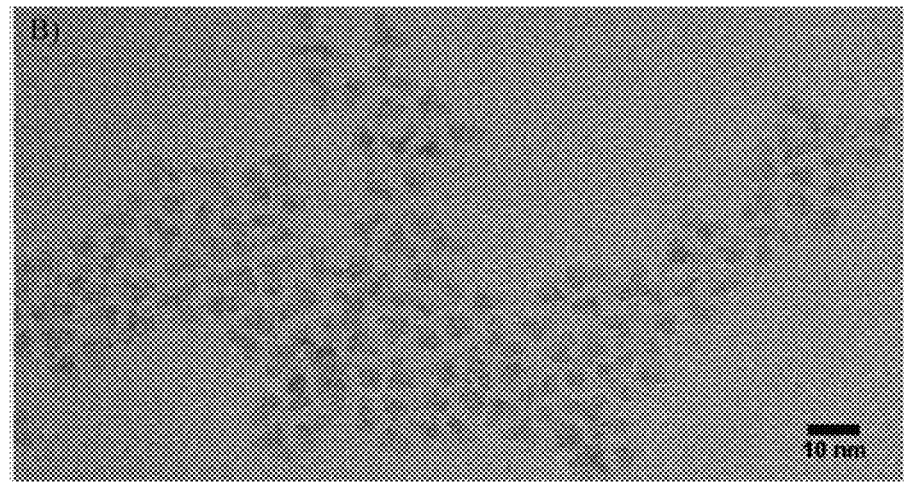

The appearance of indium metal during synthesis might cause concern over the formation of metal nanoparticles. The existence of metal nanoparticles, however, could only be observed in TEM images of samples annealed for multiples of the time required for the completion of quantum dot growth. Reversibility of the equilibrium, as well as inability of relevant indium species besides indium(I) to drive the conversion of tris(amino)arsenic towards InAs are therefore evident. The possibility of employing indium(III) salts and indium metal over indium(I) opens up a more diverse and more widely available range of reagents to be explored in future optimizations of synthesis protocols of indium-based colloidal QDs. Following previously established procedures, CdSe shells were grown on purified InAs QD cores to enhance and stabilize their optical properties, specifically their photoluminescence quantum yield (PLQY) and emission profile (FIGS. 7A-7D). Based on calculations for spherical InAs cores, a shell of 0.5 monolayers of CdSe was found to be optimal for all particle sizes and consistently led to narrower emission lineshapes with a FWHM of approximately 120 meV. The proposed quasi-type II band alignment between InAs and CdSe is thought to lead to a delocalization of electrons into the shell. The concomitant redshift in optical properties red shifts the core-shell particles into the short-wave infrared (SWIR). Emissive in a range of 1000 to 1500 nm, these particles promise to be relevant for a wide selection of potential optoelectronic applications from biomedicine to telecommunications. FIG. 7D shows a typical progression of PLQY and FWHM during shell growth for a sample with final emission centered at 1250 nm. Shape and size uniformity of the synthesized core-shell particles is consistently improved compared to core-only particles. To further demonstrate the compatibility of InAs-based QDs synthesized by this method with established passivation strategies, subsequent shell growth of CdS and ZnS was conducted. Both materials form a type I band alignment with the underlying particle to furnish core-shell-shell constructs with superior ambient and long term stability. While in the case of CdS a modest redshift is observed, ZnS shells tend to blueshift the emission, pointing towards alloying of the two shells. Both shells promote high PLQY and stability, imparting this passivation strategy with a degree of flexibility.

In conclusion, the translation of the rich redox chemistry of indium compounds into the field of colloidal nanomaterial synthesis was demonstrated. The use of indium(I) as the active species opens up a new platform for the development and optimization of indium-based QD synthesis. Comparably slow reaction kinetics and a dynamic equilibrium between indium species allows for at-scale synthesis of InAs-based QDs spanning an optical window starting in the near infrared and reaching far into the SWIR. The scheme developed here combines a synthesis of colloidal InAs QDs without the need for pyrophoric precursors, along with an internal reducing agent to convert tris(amino)arsenic precursors. Taken together, the simplicity, scalability and tunability of the reported approach should inspire research into a new direction for indium-based colloidal quantum dot preparations and their industry-relevant applications in the near infrared and SWIR.

Advantages and Improvements over Existing Technologies

This scheme signifies the first high-quality synthesis of InAs QDs without any need for pyrophoric reagents. Unprecedented ease of use, commercial availability and scalability set this synthesis apart from reports found in the literature. This is particularly important for industrial applications of QDs that often require safe, scalable, and reliable processes.

In general, colloidal synthesis of nanocrystals can be used to manufacture nanocrystals. Colloidal synthesis is described, for example, in Murray, C. B., et al., J. Am. Chem. Soc. 1993, 115, 8706, Peng, X., et al., J. Am. Chem. Soc. 1997, 119, 7019, Dabbousi, B. O., et al., J. Phys. Chem. B 1997, 101, 9463, and Cao, Y. W. and Banin, U., Angew. Chem. Int. Edit. 1999, 38, 3692, each of which is incorporated by reference in its entirety. The colloidal synthetic route can be applied to any II-VI and III-V semiconductor materials. Colloidal synthesis as applied to type II heterostructure semiconductor nanocrystals is described in U.S. Patent Application Publication No. 2004/0110002, which is incorporated by reference in its entirety.

A nanocrystal having a central region and a distal region (or regions) can be described by a radius ratio. The radius ratio can be defined as the ratio of the radius of the distal region to the radius of the central region. The central region can have a radius in the range of 1 nm to 7 nm (such as between 1.5 nm and 5 nm), and the distal regions can have a radius in the range of 1 nm to 10 nm (such as between 1.5 nm and 5 nm). Accordingly, a barbell-shaped nanocrystal can have a radius ratio in the range of 0.1 to 10 (such as between 0.3 and 3.5). In some embodiments the radius ratio can be about 1. In other embodiments it can be substantially different than about 1, such as, for example, between 0.1 and 0.95 or between 1.05 and 10.

The nanocrystal can be a member of a population of nanocrystals having a narrow size distribution. The nanocrystal can be a sphere, rod, disk, or other shape. The nanocrystal can include a first semiconductor material. The nanocrystal can include a first semiconductor material having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. The first semiconductor material can include a Group II-VI compound, a Group II-V compound, a Group III-VI compound, a Group III-V compound, a Group IV-VI compound, a Group I-III-VI compound, a Group II-IV-VI compound, a Group II-IV-V compound, or mixtures thereof. For example, the first semiconductor material can include for example, ZnO, ZnS, ZnSe, ZnTe, CdO, CdS, CdSe, CdTe, MgO, MgS, MgSe, MgTe, HgO, HgS, HgSe, HgTe, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

In some embodiments, the nanocrystal includes a first semiconductor material including a Group compound. For example, the first semiconductor material can include for example, a copper indium diselenide such as a doped copper indium diselenide or other copper indium diselenide, or alloyed copper indium diselenide, such as, for example, copper indium zinc diselenide, or copper indium gallium diselenide. The first semiconductor material can include a copper indium disulfide such as a doped copper indium disulfide or other copper indium disulfide, or alloyed copper indium disulfide. Other elements alloyed with copper indium diselenide and/or copper indium disulfide can include sulfur, aluminum, or silver; for example, $CuInS_2$, $CuIn(S, Se)_2$, $Cu(In,Al)Se_2$, $Cu(In,Ag)Se_2$, or others.

The nanocrystal can include a second semiconductor material. The second semiconductor material can a composition different from the composition of the first semiconductor material. The first and second semiconductor materials can be selected to provide a desired band structure, such as a type I or a type II heterostructure. The second semiconductor material can be adjacent to the first semiconductor material, such that a junction is formed. The junction can be abrupt or graded. In a graded junction, the first material blends with the second material in the junction, providing a graded change in material. In contrast, in an abrupt junction there is little or substantially no blending of the materials.

The junction between two semiconductor materials can have different configurations depending on the shape of the nanocrystal. For example, a spherical nanocrystal can have a spherical core of a first semiconductor material coated with a shell of a second semiconductor material. A rod shaped nanocrystal can a rod of a first semiconductor material and a second semiconductor material. The second semiconductor material can coat the length and ends of the rods substantially evenly. Alternatively, the length and ends of the rod can be coated to different degrees. In particular the ends of the rod can coated to a greater degree than the length of the rod. The ends of the rod each can be coated by an approximately spherical region of a second semiconductor material. In this case, the nanocrystal can have a barbell shape.

The second semiconductor material of the nanocrystal can include a Group II-VI compound, a Group II-V compound, a Group III-VI compound, a Group III-V compound, a Group IV-VI compound, a Group compound, a Group II-IV-VI compound, a Group II-IV-V compound, or mixtures thereof. For example, the second semiconductor material can include ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals.

An alloy can have the formula $M^1_iM^2_jM^3_kE^1_xE^2_yE^3_z$. $M^1$, $M^2$ and $M^3$ and can each independently be a group I, group II, group III, or group IV element. $E^1$, $E^2$ and $E^3$ each independently can be a group IV, group V, or group VI element. For example, $M^1$, $M^2$ and $M^3$ can each independently be magnesium, zinc, copper, cadmium, mercury, aluminum, gallium, indium, thallium, silicon, germanium, tin, or lead; and $E^1$, $E^2$ and $E^3$ each independently can be silicon, germanium, tin, lead, nitrogen, phosphorus, arsenic, antimony, oxygen, sulfur, selenium, or tellurium.

In general, the values of i, j, k, x, y, and z are non-negative. In some instances, the value of i, j, k, x, y, or z can be an integer. For example, an alloy can have the formula $M^1E^1_xE^2_y$. In this formula, the value of i is 1 and the values of j and k are zero (alternatively, $M^1$, $M^2$ and $M^3$ are identical), and the value of z is zero (alternatively, $E^2$ and $E^3$ are identical). The sum of i, j and k can be an integer, and the sum of x, y and z can be an integer. For example, if the sum of x and y is 1, the preceding formula can be expressed as $M^1E^1_xE^2_{1-x}$. In another example, an alloy can have the formula $M^1_iM^2_{1-i}E^1$. An alloy can have the formula $M^1_iM^2_jM^3_kE^1_x$ or $M^1_iM^2_jM^3_kE^1_xE^2_y$.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region.

The population of nanocrystals can have a narrow size distribution. The population can be monodisperse and can exhibit less than a 15% rms deviation in size of the nanocrystals, preferably less than 10%, more preferably less than 5%. Spectral emissions in a narrow range of between 10 and 150 nm full width at half max (FWHM) can be observed (in other words, FWHM of less than 0.05 eV, or of less than 0.03 eV). Semiconductor nanocrystals can have emission quantum efficiencies of greater than 2%, 5%, 10%, 20%, 40%, 60%, 70%, or 80%.

The most well studied nanocrystal system, cadmium selenide, includes toxic cadmium. See, e.g., Murray C B, et al. *Ann. Rev. Matrl. Sci.* 2000, 30: 545-610, which is incorporated by reference in its entirety. Nakamura and Castro have prepared nanocrystals from nontoxic materials, but quantum yields in the range of 0.1% to 5%, or less. Nakamura H, et al. *Chem. Matr.* 2006 18:3330-3; Castro, S. et al. *J. Phys. Chem. B* 2004 108:1242-35; and Castro et al. *Chem Matrl* 2003, 15, 3142-5; each of which is incorporated by reference in its entirety. Nanocrystals that are composed of non-toxic materials, are highly luminescent (e.g., having a luminescence quantum yield of 10% or greater) and are prepared in narrow size distributions can be useful in applications such as biological imaging agents, photovoltaic cells, and optoelectronic devices. See, for example, Kim S-W, et al., *JACS* 2005, 127: 10526-10532; Zimmer J P, et al., *JACS* 2006, 128: 2526-2527; and Huynh W U, et al., *Science* 2002, 295: 2425-2427, each of which is incorporated by reference in its entirety.

The nanocrystal can composed of substantially non-toxic materials. For example, the nanocrystal can be substantially free of toxic elements such as cadmium, mercury, arsenic, thallium and lead.

The method of manufacturing a nanocrystal is a colloidal growth process and can produce a monodisperse particle population. Colloidal growth occurs by rapidly injecting an M donor(s) and an E donor(s) into a hot coordinating agent. In another variation, the M donor or M donors are dissolved in a hot coordinating agent, and an E donor or E donors are rapidly injected. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size.

Preparation and manipulation of nanocrystals are described, for example, in U.S. Pat. No. 6,322,901, which is incorporated by reference in its entirety.

The nanocrystal is a member of a population of nanocrystals. As a result of the discrete nucleation and controlled growth, the population of nanocrystals obtained can have a narrow, monodisperse distribution of sizes. The process of controlled growth and annealing of the nanocrystals in the coordinating agent that follows nucleation can also result in uniform surface derivatization and regular core structures. As the size distribution sharpens, the temperature can be raised to maintain steady growth. By adding more M donor or E donor, the growth period can be shortened.

The M donor(s) can be an inorganic compound that disproportionates into two M species, one with a higher oxidation state and the other with a lower oxidation state. The M donor(s) can be a metal salt, an organometallic compound (e.g., an alkyl metal compound such as triethyl gallium or trimethyl indium), or elemental metal. The inorganic compound can be a salt (e.g., a carboxylate salt, an acetylacetonate salt, a metal halide, a metal oxide, a metal alkoxide, and the like). The salt can be combined with a coordinating agent, such as an amine. See, for example, U.S. Pat. No. 6,576,291, which is incorporated by reference in its entirety. M can be cadmium, zinc, copper, magnesium, mercury, aluminum, gallium, indium or thallium.

The E donor(s) can be a compound capable of reacting with the M donor to form a material with the general formula $M^1_iM^2_jM^3_kE^1_xE^2_yE^3_z$. Typically, the E donor can have an E atom with a positive oxidation state. Suitable E donors include amino selenides, amino tellurides, amino antimonides, amino arsenides, or amino sulfides. In certain embodiments, the M donor and the E donor can be moieties within the same molecule.

A coordinating agent can help control the growth of the nanocrystal. The coordinating agent is a compound having a donor lone pair that, for example, has a lone electron pair available to coordinate to a surface of the growing nanocrystal. The coordinating agent can be a solvent. Solvent coordination can stabilize the growing nanocrystal. Typical coordinating agents include alkyl phosphines, alkyl phosphine oxides, alkyl phosphonic acids, or alkyl phosphinic acids, however, other coordinating agents, such as pyridines, furans, and amines may also be suitable for the nanocrystal production. Examples of suitable coordinating agents include pyridine, tri-n-octyl phosphine (TOP) and tri-n-octyl phosphine oxide (TOPO). Technical grade TOPO can be used.

Nanocrystal shape can be determined by synthesis conditions, notably by the coordinating solvent(s) present during nanocrystal synthesis. The nanocrystal can be a sphere, rod, disk, or other shape. See, e.g., U.S. Pat. Nos. 6,225,198; 6,306,736; and 6,855,202, each of which is incorporated by reference in its entirety. Nanocrystal shape can be further controlled by the conditions under which a second semiconductor material is added to the nanocrystal.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average size, a population having a desired average nanocrystal size can be obtained. For example, a population of rod-shaped nanocrystals can have an average length of between 3 nm and 100 nm, such as between 5 nm and 40 nm. The population can have an average radius of between 1 nm and 10 nm, such as between 1.5 nm and 5 nm.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean size, preferably 10% rms deviation or less, and more preferably 5% rms deviation or less.

The outer surface of the nanocrystal can include a layer of compounds derived from the coordinating agent used during the growth process. The surface can be modified by repeated exposure to an excess of a competing coordinating group to form an overlayer. For example, a dispersion of the nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

A cap including a second semiconductor material can be added to the nanocrystal. A capping process is described, for example, in U.S. Pat. No. 6,322,901, which is incorporated by reference in its entirety. By adjusting the temperature of the reaction mixture during capping and monitoring the absorption spectrum of the core, capped materials having high emission quantum efficiencies and narrow size distributions can be obtained. The shape of the cap can depend on the shape of the initial nanocrystal and the capping conditions used. For example, a cap grown on an approximately spherical nanocrystal can also be approximately spherical. In this case, the cap can substantially coat the spherical nanocrystal. If the initial nanocrystal is rod-shaped, the cap can be grown primarily on the ends of the rod and very little of the second semiconductor material added along the axis of the rod. A rod-shaped nanocrystal can be capped with a rod-shaped cap, or with an approximately spherical cap. Capping conditions, such as solvent composition and temperature, can determine the shape of the cap. For example, when caps are added under conditions that favor rod-shaped growth, rod-shaped caps can be formed; in contrast, approximately spherical caps are formed when the capping conditions favor approximately spherical growth.

It can be advantageous to purify semiconductor nanocrystals before a second semiconductor material is added to the nanocrystal. As discussed above, the nanocrystals can be purified by size-selective precipitation. After purification the nanocrystals can be treated with an etching agent. The etching agent can reduce the number of defect sites on the nanocrystals. Defect sites can act as undesired nucleation sites during addition of a second semiconductor nanocrystal. In making barbell-shaped nanocrystals, nucleation is desired at the ends of rods, but defect sites can cause nucleation along the length of a rod. Because the etching agent reduces the number of defect sites, the resulting barbells will have fewer warts along the length of the rods than barbells prepared without a prior etching treatment. The etching agent can be an amine, such as a primary amine, e.g., octylamine. An etching agent can be included during addition of a second semiconductor material to a nanocrystal.

Two-pot synthesis of nanocrystals can improve (compared to one-pot synthesis) the quality of the heterojunction by minimizing contamination of the one material with the other material. Adding the nanocrystals at temperatures normally used for core growth (rather than nucleation) can reduce overcoating of a rod (e.g., along the length of the rod) by the second semiconductor material.

Transmission electron microscopy (TEM) can provide information about the size, shape, and distribution of the nanocrystal population. Powder X-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

Experimental Details

Chemicals. Indium powder (99.99%, 325 mesh), indium (I) chloride (InCl, 99.999%), oleic acid (OA, 90%), dodecylphosphonic acid (DDPA, 95%), selenium (99.999%) and zinc oxide (ZnO, 99.999%) were purchased from Alfa Aesar. Trioctylphosphine (TOP, 97%), oleylamine (OAm, 70%), 1-octadecene (ODE, 90%), toluene (99.8%), acetonitrile (ACN, 99.9%), carbon tetrachloride ($CCl_4$, 99%) and sulfur (99.998%) were purchased from Sigma-Aldrich. Indium(III) chloride ($InCl_3$, 99.999%), tri s(dimethylamino) arsine (DMAAs, 99%) and cadmium oxide (CdO, 99.999%) were purchased from Strem Chemicals. All chemicals were used as received. Indium powder, InCl, $InCl_3$ and TOP are stored and handled in an inert atmosphere.

Instrumentation. Absorption spectra were measured on a UV-VIS-NIR spectrometer (Agilent, Cary 5000) and baseline-corrected using absorption through solvents. Photoluminescence (PL) spectra were recorded on a setup built in-house. Following excitation with a 532 nm diode laser (Thorlabs, CPS532), emission was collected with two silver-coated off-axis parabolic mirrors, focused to the entrance slit of a monochromator (Princeton Instruments, SP2750A) equipped with a 80 gr/mm, 1300 nm blaze optical diffraction grating (Princeton Instruments) and imaged using a liquid nitrogen-cooled InGaAs array detector (Princeton Instruments, OMA V:512-1.7 LN). PL quantum yields (PLQYs) were obtained using an integrating sphere (Labsphere, RTC-060-SF) setup. The samples were excited with a 785 nm diode laser (Thorlabs, LDM785) chopped at 210 Hz using an optical chopper, and the output was recorded with a calibrated germanium photodetector (Newport, 818-IR) using a lock-in amplifier (Stanford Research Systems, SR830). The samples were contained in a PTFE-capped quartz cuvette. A solvent blank was used in conjunction with a colored glass longpass filter (Schott Glass, RG850) blocking the excitation beam to allow correction of the obtained PLQY values for leakage of the excitation light and transmittance of the filter. Additionally, the measured photocurrent was adjusted for the external quantum efficiency of the photodetector. Transmission electron microscopy (TEM) images were acquired on a JOEL 2010 Advanced High Performance TEM operating at 200 kV with a lanthanum hexaboride cathode. Samples were prepared by drop-casting a solution containing the QDs of interest in an apolar solvent (toluene or $CCl_4$) onto a copper grid with an amorphous carbon film (Ted Pella, 400 mesh). Powder X-ray diffraction patterns were obtained using a multipurpose diffractometer (Rigaku Smartlab) with a 9 kW rotating Cu-Kα X-ray source aligned in a Bragg-Brentano geometry. For sample preparation, a solution of InAs QDs in toluene was dropcast onto a zero diffraction plate (MTI Corp., Si crystal, P-type B-doped) and the solvent allowed to evaporate. The resulting thin film was encapsulated with polyimide tape to ensure stability of the InAs QDs over the course of the measurement.

Synthetic Procedures.

Standard InAs core synthesis. In a typical synthesis, a 25 mL three-necked round-bottom flask is equipped with a reflux condenser and charged with 7.2 mL OAm and a magnetic stir bar. The solvent is degassed at 100° C. (100 mTorr) for 1 h. After switching to a nitrogen atmosphere and cooling to room temperature, 0.3 mL TOP and 75 mg (0.5 mmol, 3.1 eq) InCl are added. Addition of 20 mg DDPA at this point is necessary to achieve core sizes with absorption features at 800 nm or below. Subsequently, the mixture is heated to 240° C. Separately, 1 mL OAm is heated to 50° C. inside a glove box and 75 μL DMAAs are added. After 5 min, gas formation has ceased and 0.4 mL (0.16 mmol As, 1 eq) of the resulting precursor solution are withdrawn with a syringe for injection. Once the reaction mixture reaches reaction temperature, the arsenic precursor is swiftly injected under vigorous stirring. The progress of the reaction is followed by drawing aliquots and measuring their absorption at 450 nm in $CCl_4$. After 90 min of reaction time, the flask is cooled down to room temperature and per 5 mL crude solution 5 mL toluene, followed by 15 mL ACN are added to induce precipitation. The mixture is centrifuged at 8000 rpm for 2 min and the supernatant discarded. The pellet is redispersed in 5 mL toluene and crashed one more time with 15 mL ACN. Following centrifugation, the pellet is redispersed in toluene or hexanes. A last round of centrifugation and filtration through a 0.2 μm PTFE syringe filter (VWR Syringe Filters) furnishes the final InAs QD dispersion.

InAs core scale-up. The scaled-up synthesis yielding InAs QDs on gram scale was conducted in an analogous fashion, employing a mechanical stirrer instead of a magnetic stir bar.

InAs core precursor variation. The control experiment employing In and $InCl_3$ as precursors was conducted in an analogous fashion, substituting 75 mg InCl for 38 mg indium powder and 37 mg $InCl_3$.

InAs core synthesis with hot and continuous injection. This scheme is overall similar to the standard InAs core synthesis above, with some adaptations. In a typical synthesis, a 25 mL three-necked round-bottom flask is equipped with a reflux condenser and charged with 7.2 mL OAm and a magnetic stir bar. The solvent is degassed at 100° C. (100 mTorr) for 1 h. After switching to a nitrogen atmosphere and cooling to room temperature, 0.3 mL TOP and 225 mg (1.5 mmol, 9.3 eq) InCl are added and the mixture is heated to 240° C. Separately, 2 mL OAm is heated to 50° C. inside a glove box and 150 μL DMAAs are added. After 5 min, gas formation has ceased. 0.4 mL (0.16 mmol As, 1 eq) of the precursor solution are withdrawn for hot injection, and 0.8 mL (0.32 mmol As, 2 eq) are withdrawn in a separate syringe for continuous injection. Once the reaction mixture reaches reaction temperature, the arsenic precursor is swiftly injected under vigorous stirring. After 20 min of reaction time, additional As precursor is injected via a syringe pump over 2 h, followed by 30 min of annealing at 280° C. The workup was conducted analogously to the standard InAs core synthesis.

InAs core synthesis solely with continuous injection. This scheme closely follows the standard core synthesis up to single hot injection. Instead of the single hot injection, the As precursor is injected into the reaction mixture continuously via a syringe pump over the course of 90 min.

Cadmium oleate ($Cd(Ol)_2$). A 100 mL three-necked round-bottom flask is charged with CdO (1.027 g, 8 mmol, 1 eq) and OA (20 mL, 64 mmol, 8 eq). While stirring, the mixture is degassed at room temperature for 1 h, followed by another 2 h at 100° C. Subsequently, the flask is switched to a nitrogen atmosphere and heated to 200° C. until a clear solution is obtained. ODE (20 mL) is added, and the solution is degassed again at 100° C. for 30 min to yield a 0.2 M solution of $Cd(Ol)_2$.

Zinc oleate ($Zn(Ol)_2$). A 0.1 M solution of $Zn(Ol)_2$ is obtained in an analogous fashion to the $Cd(Ol)_2$ solution described above by substituting CdO for ZnO and adding 40 mL of OAm after cooling down to room temperature.

Trioctylphosphine selenide (TOPSe). A 40 mL scintillation vial is charged with selenium powder (32 mg, 4 mmol, 1 eq), TOP (4 mL, 9 mmol, 2.25 eq) and ODE (16 mL). The mixture is sonicated until all solids are dissolved to yield a 0.2 M solution of TOPSe.

Sulfur in 1-octadecene (ODE/S). A 100 mL three-necked round-bottom flask is charged with ODE (40 mL) and sulfur (58 mg, 1.8 mmol) and stirred while heating to 100° C. under vacuum until all solids have dissolved, furnishing a 0.045 M solution of ODE/S.

General shell growth remarks. For all shell growth procedures, the amount of precursors necessary to grow a certain shell thickness is estimated by a sizing curve based on spherical particles.[1] In short, an absorption spectrum of a purified InAs QD solution is recorded, and the position of the first excitonic feature, together with the absorption at 450 nm, are used to assess the size and concentration of QDs in solution. Precursor amounts are then determined based on the material needed to grow successive monolayers on cores of the specified size. In case of more than one shell, the estimated amounts of precursor required for the second shell are treated like a continuation of the first shell. The progress of shell growth was tracked by drawing aliquots and measuring absorption, emission lineshape and PLQY dispersed in $CCl_4$.

CdSe shell growth. In a typical reaction, a 50 mL four-necked round-bottom flask is charged with OAm (5 mL) and ODE (5 mL), connected to a condenser and degassed at 100° C. for 1 h under stirring. InAs QDs (40 nmol, 4.2 nm) in hexanes, synthesized and purified as described above, are introduced and the volatiles removed by degassing at room temperature for 1 h. Separately, two syringes with 0.05 M $Cd(Ol)_2$ (1.75 mL, 88 μmol) and 0.05 M TOPSe (1.75 mL, 88 μmol) in ODE are prepared. The InAs dispersion is heated to 240° C. for shell growth. At 100° C., the atmosphere is switched to nitrogen, and at 200° C. injection of the two shell precursor solutions is started at a rate of 0.9 mL/h. After completion of the shell growth, the core-shell particles can be purified by addition of toluene and precipitation with ACN twice. The exact amounts needed will vary based on initial core size and thickness of the shell grown. The final particles are filtrated through a 0.2 μm syringe filter and stored in toluene or hexanes.

CdS and ZnS shell growth. Overcoating of InAs/CdSe core-shell QDs with a second shell of either CdS or ZnS is carried out analogously to the CdSe shell growth. For ZnS, 0.05 M Cd(Ol)$_2$ is substituted with 0.05 M Zn(Ol)$_2$ in ODE. Both procedures use 0.045 M ODE/S in ODE as the chalcogenide precursor and a 10% excess of Cd/Zn compared to S, respectively.

FIG. 8A through FIG. 14 depict properties of materials made as described herein.

Other embodiments are within the scope of the following claims.

What is claimed is:

1. A method of making a semiconductor nanocrystal comprising:
    contacting an M donor including a Group III element in an oxidation state lower than the highest oxidation state of a Group II element or Group III element with an E donor including a Group V element or Group VI element in an oxidation state higher than the oxidation state of the Group V element or Group VI in a product semiconductor material; and
    decomposing the M donor in the presence of the E donor, thereby forming a population of nanocrystal cores including the product semiconductor material
    wherein the M donor includes In(I) or a mixture of indium species generating In(I).

2. The method of claim 1, wherein the E donor includes As(III).

3. The method of claim 1, wherein the product semiconductor is a III-V, or III-VI semiconductor material, or mixtures thereof.

4. The method of claim 1, wherein the E donor includes a pnictogen atom in a formal oxidation state of +III surrounded by amino groups.

5. The method of claim 1, further comprising forming a first overcoating on a surface of the core, the first overcoating including a second semiconductor material.

6. The method of claim 5, further comprising forming a second overcoating on a surface of the first overcoating, the second overcoating including a third semiconductor material.

7. The method of claim 1, wherein the nanocrystal is obtained in nearly quantitative yield relative to the E donor or the M donor.

8. The method of claim 1, wherein the decomposing includes heating.

9. A method of making a semiconductor nanocrystal comprising:
    contacting an M donor including a Group III element in an oxidation state lower than the highest oxidation state of a Group II element or Group III element with an E donor including a Group V element or Group VI element in an oxidation state higher than the oxidation state of the Group V element or Group VI in a product semiconductor material; and
    decomposing the M donor in the presence of the E donor, thereby forming a population of nanocrystal cores including the product semiconductor material wherein the M donor includes an In(I) halide.

* * * * *